US010620808B2

(12) United States Patent
Koga

(10) Patent No.: US 10,620,808 B2
(45) Date of Patent: Apr. 14, 2020

(54) METHOD FOR ASSISTING USER INPUT WITH TOUCH DISPLAY

(71) Applicant: MITUTOYO CORPORATION, Kanagawa (JP)

(72) Inventor: Tetsuya Koga, Miyazaki (JP)

(73) Assignee: MITUTOYO CORPORATION, Kanagawa (JP)

( * ) Notice: Subject to any disclaimer, the term of this patent is extended or adjusted under 35 U.S.C. 154(b) by 220 days.

(21) Appl. No.: 15/071,799

(22) Filed: Mar. 16, 2016

(65) Prior Publication Data

US 2016/0274773 A1    Sep. 22, 2016

(30) Foreign Application Priority Data

Mar. 17, 2015   (JP) ................................. 2015-052994

(51) Int. Cl.
| | | |
|---|---|---|
| *G06F 3/0484* | (2013.01) | |
| *G06F 3/0488* | (2013.01) | |
| *G06F 3/0482* | (2013.01) | |
| *G06F 3/0481* | (2013.01) | |
| *G06F 17/50* | (2006.01) | |

(52) U.S. Cl.
CPC ........ *G06F 3/04845* (2013.01); *G06F 3/0482* (2013.01); *G06F 3/04817* (2013.01); *G06F 3/04842* (2013.01); *G06F 3/04847* (2013.01); *G06F 3/04883* (2013.01); *G06F 3/04886* (2013.01); *G06F 17/50* (2013.01); *G06F 2203/04806* (2013.01); *G06F 2203/04808* (2013.01)

(58) Field of Classification Search
None
See application file for complete search history.

(56) References Cited

U.S. PATENT DOCUMENTS

| | | | |
|---|---|---|---|
| 7,769,222 B2 | 8/2010 | Blanford, Jr. et al. | |
| 7,889,193 B2* | 2/2011 | Platonov ................. | G06T 15/20 |
| | | | 345/419 |
| 2008/0034289 A1* | 2/2008 | Doepke ............... | G06F 3/04812 |
| | | | 715/700 |

(Continued)

FOREIGN PATENT DOCUMENTS

| | | |
|---|---|---|
| JP | H08-147491 A | 6/1996 |
| JP | 09-237157 A | 9/1997 |

(Continued)

OTHER PUBLICATIONS

"Word & Excel & PowerPoint & Outlook 2013Basic Manual", ISBN978-4-7741-6574-5 C3055, Jul. 25, 2014, with English translation.

(Continued)

*Primary Examiner* — Christopher J Fibbi
(74) *Attorney, Agent, or Firm* — Greenblum & Bernstein, P.L.C.

(57) ABSTRACT

An input support tool is displayed on a display screen. The input support tool includes a diagram, and a handle corresponding to at least a part of the diagram, and enables manipulation of the at least a part of the diagram. Each of the handles are arranged at a position separated from the respective at least a part of the diagram. A touch screen panel detects user operation of each handle, and reflects the operation in a movement of each part of the diagram.

11 Claims, 18 Drawing Sheets

(56) References Cited

U.S. PATENT DOCUMENTS

| | | | |
|---|---|---|---|
| 2008/0059914 A1* | 3/2008 | Allyn | G06F 3/04812 715/859 |
| 2011/0018806 A1 | 1/2011 | Yano | |
| 2011/0145759 A1* | 6/2011 | Leffert | G06F 3/04845 715/800 |
| 2012/0078589 A1* | 3/2012 | McDaniel | G06F 3/04815 703/1 |
| 2013/0201210 A1* | 8/2013 | Vaddadi | G06T 19/006 345/632 |
| 2014/0072198 A1* | 3/2014 | Moon | A61B 6/461 382/131 |
| 2014/0282220 A1* | 9/2014 | Wantland | G06F 3/04845 715/782 |
| 2015/0067559 A1* | 3/2015 | Missig | G06F 3/04845 715/765 |
| 2015/0094992 A1* | 4/2015 | Battcher | G06F 17/5004 703/1 |
| 2016/0326808 A1* | 11/2016 | Ansari | E21B 10/43 |

FOREIGN PATENT DOCUMENTS

| | | |
|---|---|---|
| JP | 11-237221 A | 8/1999 |
| JP | 2000-267808 A | 9/2000 |
| JP | 2008-112449 A | 5/2008 |
| JP | 2011-028524 A | 2/2011 |
| JP | 5132028 B | 1/2013 |

OTHER PUBLICATIONS

Office Action issued in Japanese family member Patent Appl. No. 2015-052994, dated Oct. 23, 2018.

Office Action issued in Japanese family member Patent Appl. No. 2015-052994, dated Apr. 9, 2019, along with an English translation thereof.

* cited by examiner

METHOD FOR ASSISTING USER INPUT WITH TOUCH DISPLAY

CROSS-REFERENCE TO RELATED APPLICATIONS

The present application claims priority under 35 U.S.C. § 119 of Japanese Application No. 2015-052994, filed on Mar. 17, 2015, the disclosure of which is expressly incorporated by reference herein in its entirety.

BACKGROUND OF THE INVENTION

1. Field of the Invention

The present invention relates to a graphical user interface. More specifically, the present disclosure relates to a method of supporting subtle user input during an input operation using a touch screen display. For example, the present disclosure relates to a method of supporting user input such that an instruction operation on a pixel level can be performed easily on a touch screen display.

2. Description of Related Art

Touch screen displays have come to be used in a variety of ways (see, for example, Japanese Patent Laid-open Publication No. H09-237157, Japanese Patent Laid-open Publication No. 2000-267808, Japanese Patent Laid-open Publication No. 2011-028524, and Japanese Patent No. 5132028). In addition, employing touch screen displays as an input device has also been explored in the field of measuring apparatuses, such as those measuring a length, outline shape, or the like of a work piece (measured object).

Touch screen displays are excellent input devices providing a user with numerous conveniences, such as being intuitive and user friendly, being capable of both display and input, having excellent portability due to being a small terminal, and the like. However, there are significant issues when performing input operations for a measuring apparatus on a touch screen display. When performing input operations for a measuring apparatus, extremely fine input instructions are often required. For example, input operations on a pixel level are becoming necessary when designating a measurement range. Accordingly, numeric values may be typed in directly, and even in cases using a GUI, fine positioning may be performed with a mouse cursor (pointer) (Japanese Patent Laid-open Publication No. H11-237221).

In this regard, a touch screen display recognizes a center of gravity of a portion pressed by a finger or stylus as an indicated location, but a fingertip or stylus tip each have an inherent broadness which makes it difficult to know precisely which pixel is being indicated. In addition, when a portion directly beneath the fingertip or stylus tip is treated as the indicated location, the indicated location is hidden by the fingertip or stylus tip and cannot be directly observed. Moreover, because glass or the like has a thickness, there is distance and optical refraction between a touch screen surface and a display surface, causing parallax.

In this situation, a delicate input operation, such as selecting a specific pixel on the display screen or moving (for example, dragging) a selected location to a specific position with extreme accuracy, is difficult. There may be a belief that a high-performance, dedicated touch screen stylus can be created and used, but this would negate the convenience of a touch screen display. For example, when use alternates between a touch screen display and another device (for example, a joystick), the user is inconvenienced by picking up the dedicated touch screen stylus each time. There is no need to entirely eliminate use of a dedicated touch screen stylus, but providing a GUI enabling sufficiently fine input with a fingertip is preferred.

Japanese Patent Laid-open Publication No. H09-237157, Japanese Patent Laid-open Publication No. 2000-267808, Japanese Patent Laid-open Publication No. 2011-028524, and Japanese Patent No. 5132028 disclose several methods of improving operability of a touch screen display, but are all inadequate for extremely fine input operations, such as operations made on a pixel level.

SUMMARY OF THE INVENTION

The present disclosure enables fine user input when performing an input operation using a touch screen display and, for example, provides an input support method in which an instruction operation on a pixel level can be performed easily on a touch screen display. User input is performed by the user contacting the touch screen with an implement including but not limited to a stylus, touch pen and/or a user's body parts such as one or more fingers. The implements are collectively referred to herein as "screen contacts."

An input support method according to the present disclosure supports input using a touch screen display performing display and reception of input by screen contact. The method includes displaying an input support tool on a display screen, the input support tool including a diagram; and a handle corresponding to at least a part of the diagram and enabling manipulation of the plurality of the at least a part of the diagram. The method further includes arranging the handle in a position separate from the at least a part of the diagram; and detecting user operation of the handle with at least one screen contact; and moving the at least a part of the diagram in response to the detected user operation.

In the present disclosure, the input support tool preferably further includes an action point defined for the at least a part of the diagram, the action point being a point where operation using the handle is effected, and the moving of the diagram in response to the detected user operation comprises moving the action point.

In the present disclosure, the handle may include a plurality of handles, and during the moving of the at least a part of the diagram, handles other than the handle operated by the user's screen contact are undisplayed on the touch screen display.

In the present disclosure, the handle may include a plurality of handles, and during the moving of the at least a part of the diagram, handles other than the handle operated by the user's screen contact and action points corresponding to the other handles are undisplayed on the touch screen display.

In the present disclosure, the input support tool preferably further includes a connecting line linking the action point with the handle.

In the present disclosure, while the user operates the handle corresponding to one of the parts with a screen contact, other connecting lines respectively linking the other action points with the other handles are preferably not displayed on the touch screen display.

In the present disclosure, an amount by which the diagram (or part thereof) moves is preferably an amount determined by multiplying a displacement amount of the user's screen contact operating the handle on the display screen by a predetermined ratio.

A touch screen display device according to the present disclosure includes a touch screen display and a display controller configured to control the touch screen display to display an input support tool on a display screen. The input support tool may include a diagram, and a handle corresponding to at least a part of the diagram and enabling manipulation of the diagram. The handle may be arranged in a position separate from the at least a part of the diagram, and the display controller may be configured to detect user operation of each handle by a screen contact, and may be further configured to move the at least a part of the diagram in response to the detected user operation.

In an input method of a measuring apparatus according to the present disclosure, the input support tool is displayed superimposed on one of a work piece image and a design image. The input support tool includes a diagram enabling designation of a range, and a handle corresponding to at least a part of the diagram and enabling manipulation of the at least a part of the diagram. The method may further include arranging the handle in a position separated from the at least a part of the diagram, and detecting user operation of the handle by a screen contact, and moving at least a part of the diagram in response to the detected user operation.

A measuring apparatus according to the present disclosure includes a measuring device main body and a touch screen display device as an input device. The touch screen display device includes the touch screen display and the display controller of the touch screen display. The display controller displays the input support tool superimposed on one of the work piece image and the design image. The input support tool includes a diagram, and a handle corresponding to at least a part of the diagram, and enabling manipulation of the at least a part of the diagram. The handle may be arranged in a position separate from the at least a part of the diagram, and the display controller may be further configured to detect a user operation of each handle by the user's screen contact, and to move at least a part of the diagram, in response to the detected user operation.

The present disclosure enables fine user input when performing an input operation using a touch screen display and, for example, is able to provide an input support method in which an instruction operation on a pixel level can be performed easily on a touch screen display.

The present invention is clarified by the following detailed description and the appended drawings. The appended drawings are referenced only to facilitate understanding and do not serve to limit the present invention.

BRIEF DESCRIPTION OF THE DRAWINGS

The present invention is further described in the detailed description which follows, in reference to the noted plurality of drawings by way of non-limiting examples of exemplary embodiments of the present invention, in which like reference numerals represent similar parts throughout the several views of the drawings, and wherein.

DETAILED DESCRIPTION OF THE INVENTION

Figure 1:
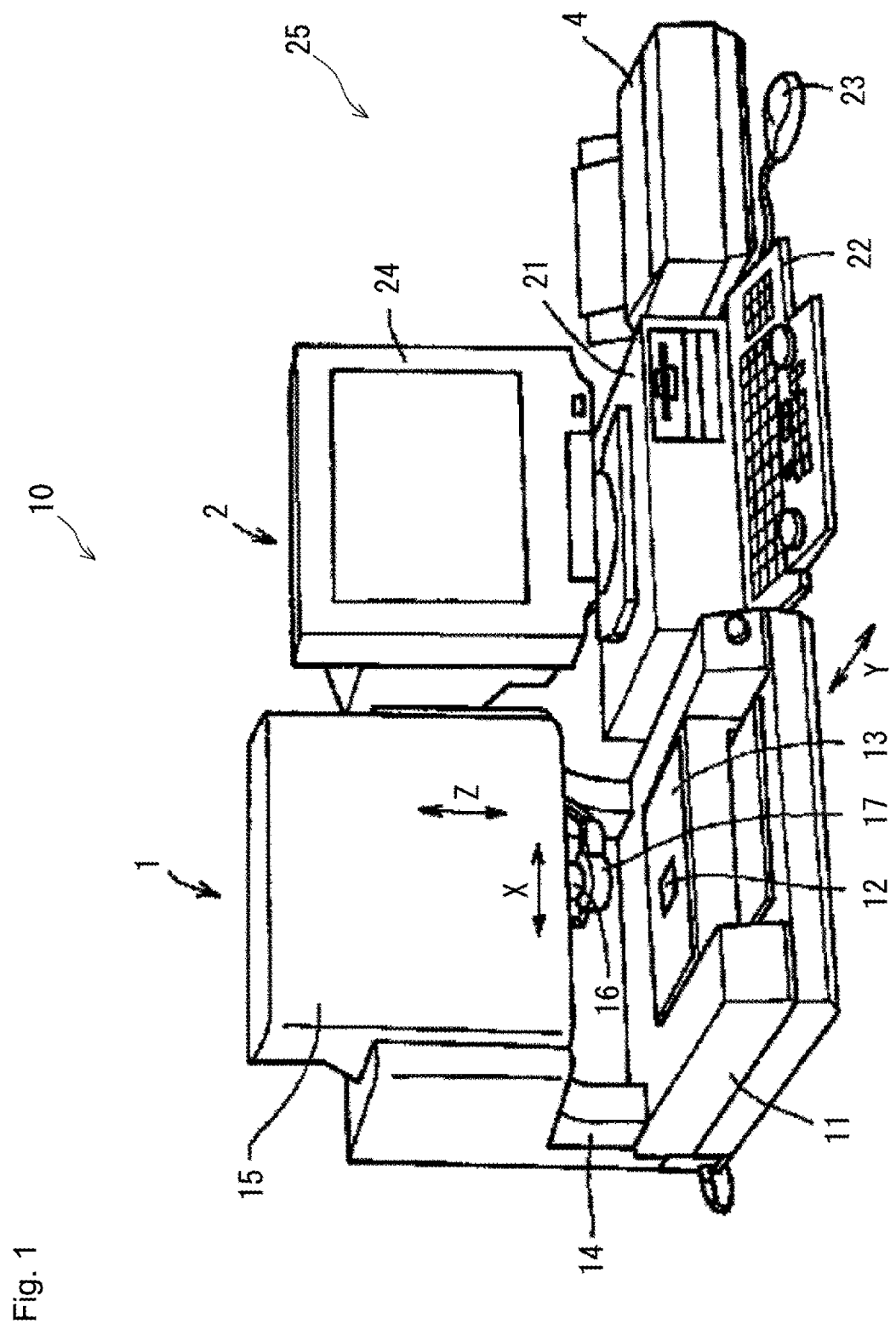
FIG. 1 illustrates an overall configuration of an image measurement apparatus.

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description taken with the drawings making apparent to those skilled in the art how the forms of the present invention may be embodied in practice.

A description of embodiments of the present invention is given with reference to the drawings and to the reference numerals assigned to each component in the drawings.

First Embodiment

The present embodiment is related to a graphical user interface that enables user input to be made with ease on a pixel level using a touch screen display. More specifically, the present disclosure relates to a graphical user interface facilitating user input on a measurement apparatus, and in particular user input to indicate a measurement range. An ordered description follows.

FIG. 1 illustrates an overall configuration of an image measurement apparatus 10. The image measurement apparatus 10 includes a measuring device main body 1 and a control computer 2 performing drive control of the measuring device main body 1 and executing necessary data processing.

The measuring device main body 1 is configured as follows. A measurement table 13 is mounted on a stage 11, and a work piece 12 (measured object) is placed on the measurement table 13. In addition, the measurement table 13 is driven in a Y-axis direction by a Y-axis drive mechanism (not shown in the drawings). A frame 14 extending upward is fixated to a back end of the stage 11, and an X axis drive mechanism and a Z axis drive mechanism (not shown in the drawings) are provided on an interior of a cover 15 projecting on a front surface from a top portion of the frame 14. A CCD camera 16 is supported by the X axis drive mechanism and the Z axis drive mechanism, and the CCD camera 16 is mounted so as to view the measurement table 13 from above. A ring-shaped illumination device 17 shining illuminating light on the work piece 12 is provided to a bottom end of the CCD camera 16.

The control computer 2 includes a computer 21 and an inputter/outputter 25. The inputter/outputter 25 includes a touch screen display 24, a keyboard 22, a mouse 23, and a printer 4.

The computer 21 is a computer having a CPU and memory. The computer 21 performs drive control of the measuring device main body 1 in response to an input operation performed by the user. In addition, the computer 21 executes processes such as shape analysis of the work piece (measured object) 12 by processing image data obtained by the CCD camera 16. Further, the computer 21 performs display control of the touch screen display 24 and provides the user with a graphical user interface. Specifically, in such a case, the computer 21 is a display controller of the touch screen display 24. In a case where the touch screen display is to be ported to a small-scale terminal, display control (the display controller) may also be installed on a touch screen display terminal.

Figure 2:
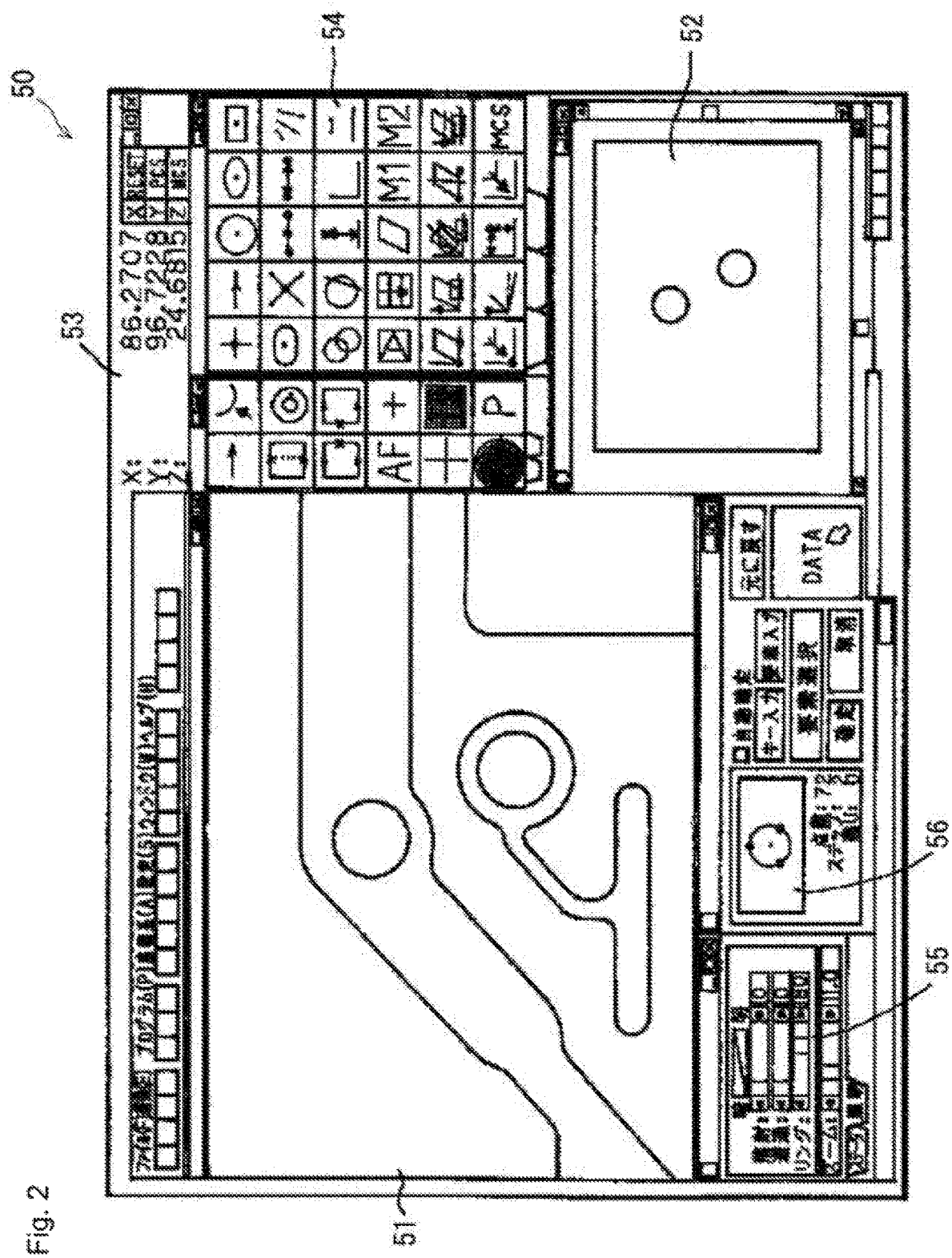
FIG. 2 illustrates an exemplary screen configuration displayed on a touch screen display.

FIG. 2 illustrates an exemplary screen configuration displayed on the touch screen display 24. The display screen is referred to as a GUI screen 50. The GUI screen 50 has, broadly speaking, six regions (windows). The GUI screen 50 includes a main window 51, a sub-window 52, a counter window 53, a function window 54, an illumination/stage window 55, and a settings window 56.

The main window 51 has the broadest area on the display screen and configures the primary window whether in image display or in receiving input. Typically, a work piece image captured by the CCD camera 16 is displayed in the main window 51. For example, in a case where the work piece image is captured by the CCD camera 16, the work piece image is displayed in the main window 51 in real time. (In the instant specification, displaying the work piece image on the display with real-time processing may in some cases be called an on-line display.) Alternatively, a design image based on design data may be displayed in the main window 51. A measurement point or measurement range may be decided while looking at the design image, and therefore, in such cases, the design image is displayed on the main window 51. Moreover, an input support tool is displayed in the main window 51 superimposed on the work piece image or design image. This is described later.

The sub-window 52 is a region somewhat smaller than the main window 51 which can display the same content as the main window 51. For example, when the work piece image is displayed in real time on the main window 51, the sub-window 52 may be configured to simultaneously display the design image, and of course the opposite configuration is also possible.

Various icons are arranged in the function window 54. Each icon corresponds to various commands such as define region, select type of shape analysis, movement command for measuring device main body, and so on. In this example, the "region" of "define region" refers to a measurement region or evaluation region, for example.

Although not the focus of the present embodiment, a simplified description is given herewith. In the present embodiment, an example is described of an image measurement device, and in this context "measurement region" refers to a region captured by a camera. When considering a scenario with a coordinate shape measuring device using a touch sensor probe, "measurement region" refers to a region where touch measurement or profiling measurement is to be performed. Furthermore, an "evaluation region" is a region targeted for shape evaluation, out of all the data obtained by a measurement (image capture). Shape evaluation refers to, for example, edge detection, fitting a geometric element (straight line, circle, arc) to a specific portion of the work piece (measured object), finding deviation from a geometric element, or finding a maximum/minimum within a specific range. Assuming that the user designates a region when using the measurement device, what that region signifies may vary in several ways depending on the type of measurement device, the purpose of the measurement, and so on.

To repeat: the focus of the present embodiment is not the question of what a region designated by the user signifies. The focus of the present embodiment is to enable a close, accurate designation of a region in accordance with a user's intent through touch operation on the touch screen display 24.

Center coordinates (X, Y, Z) of the image capture range of the CCD camera 16 are displayed in the counter window 53. The illumination/stage window 55 is a window allowing manipulation of various settings related to the illumination device 17 and the measurement table 13. The settings window 56 is a window allowing still more detailed settings to be made as necessary with respect to a command selected on the function window 54. For example, inputting a sampling pitch.

Exemplary GUI Screen Display

An exemplary GUI screen display is now described. First, as shown in FIG. 2, a work piece image is displayed in the main window 51. For ease of description, a case is discussed in which the work piece image is displayed. However, the operations which follow can be fundamentally the same even when the display is of a design image. When a range is defined while the work piece image is displayed in real time, the range definition is treated as an on-line command, whereas when a range is defined while displaying a design image rather than a real-time image, the range definition is treated as off-line teaching. The user may discriminate between use of the two.

Figure 3:
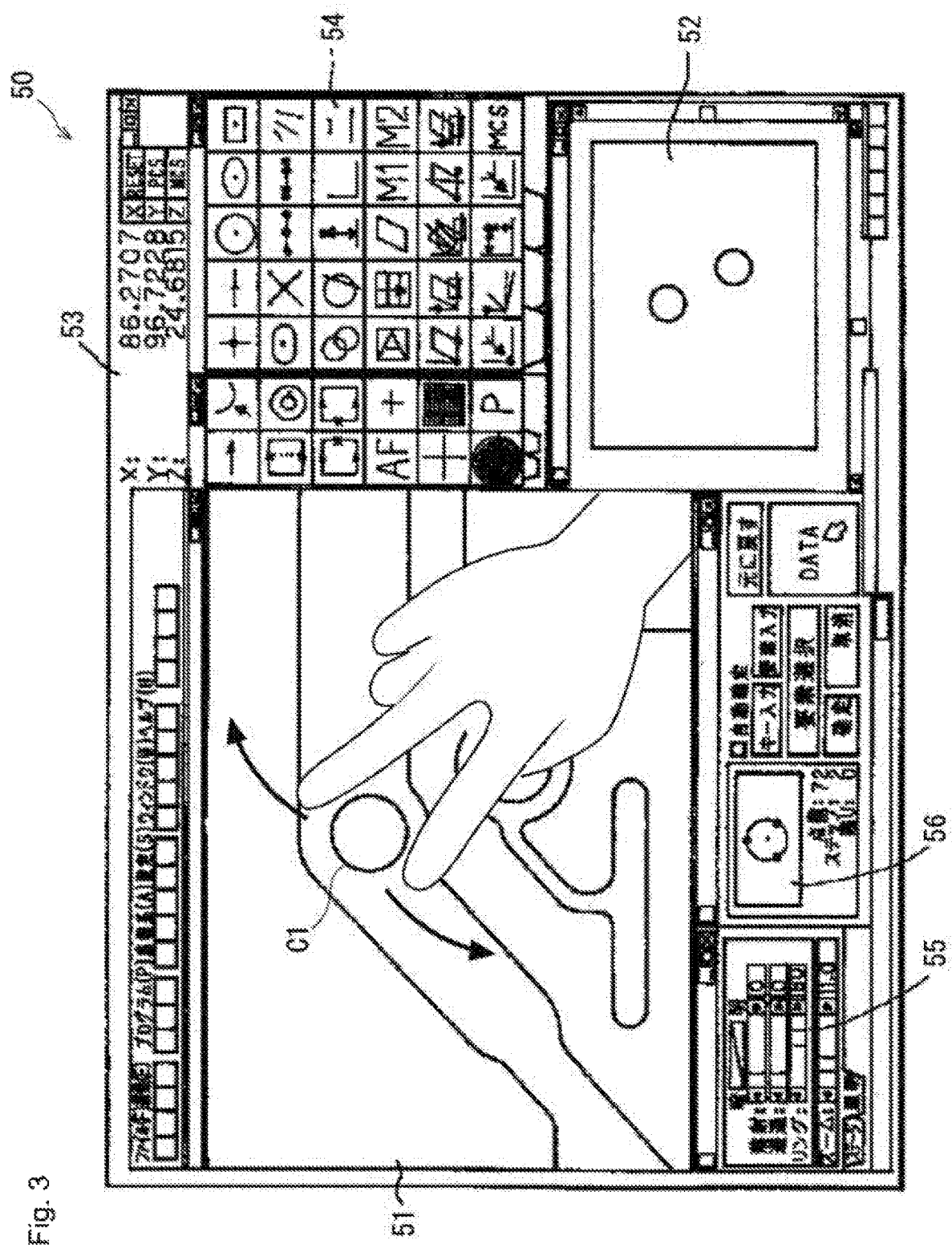
FIG. 3 illustrates a pinch-out as an exemplary input operation.

In a case where the user wishes to enlarge the display of a location at which a range definition is to be made, the user may perform a pinch-out (FIG. 3). A "pinch-out" is a well-known operation in which two fingers are rested on the touch screen display 24 to enlarge an object on the screen. In this example, a shape of a circle C1 in the work piece image is to be evaluated.

Figure 4:
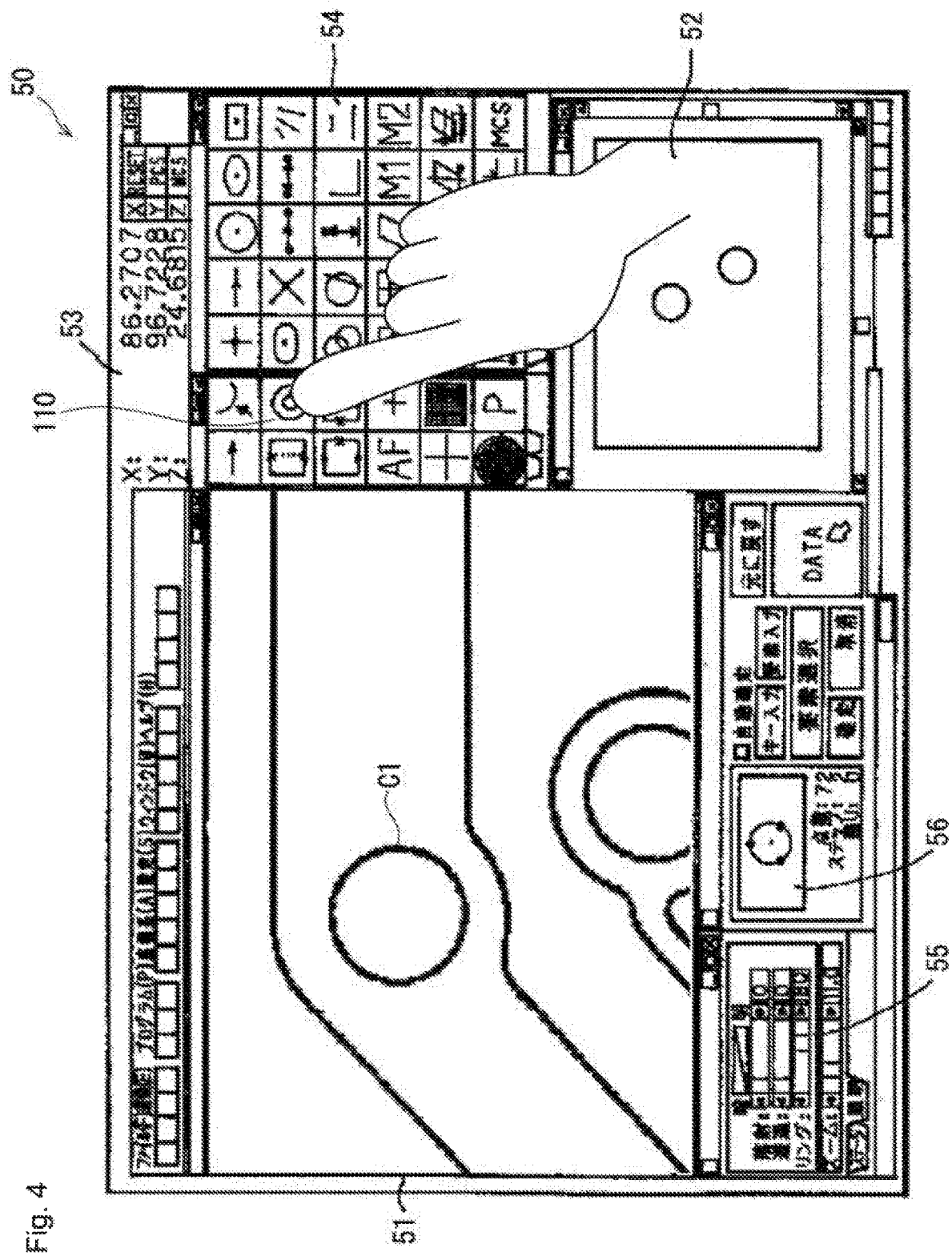
FIG. 4 illustrates icon selection as an exemplary input operation.

As shown in FIG. 4, the location at which the range definition is to be made (here, the circle C1) is displayed enlarged in the main window 51. Next, a circular range tool, which is one of the input support tools, is selected from among the icons presented in the function window 54. Specifically, an icon 110 for the circular range tool is tapped (FIG. 4).

Selection confirmation may be performed with a single tap, or may be performed with two consecutive taps. Moreover, multi-tap may be employed. For example, selection confirmation may be made once the middle finger taps the icon 110 for the circular range tool and, in that state, the index finger taps beside the icon 110. There are many such variations in tap operations.

Figure 5:
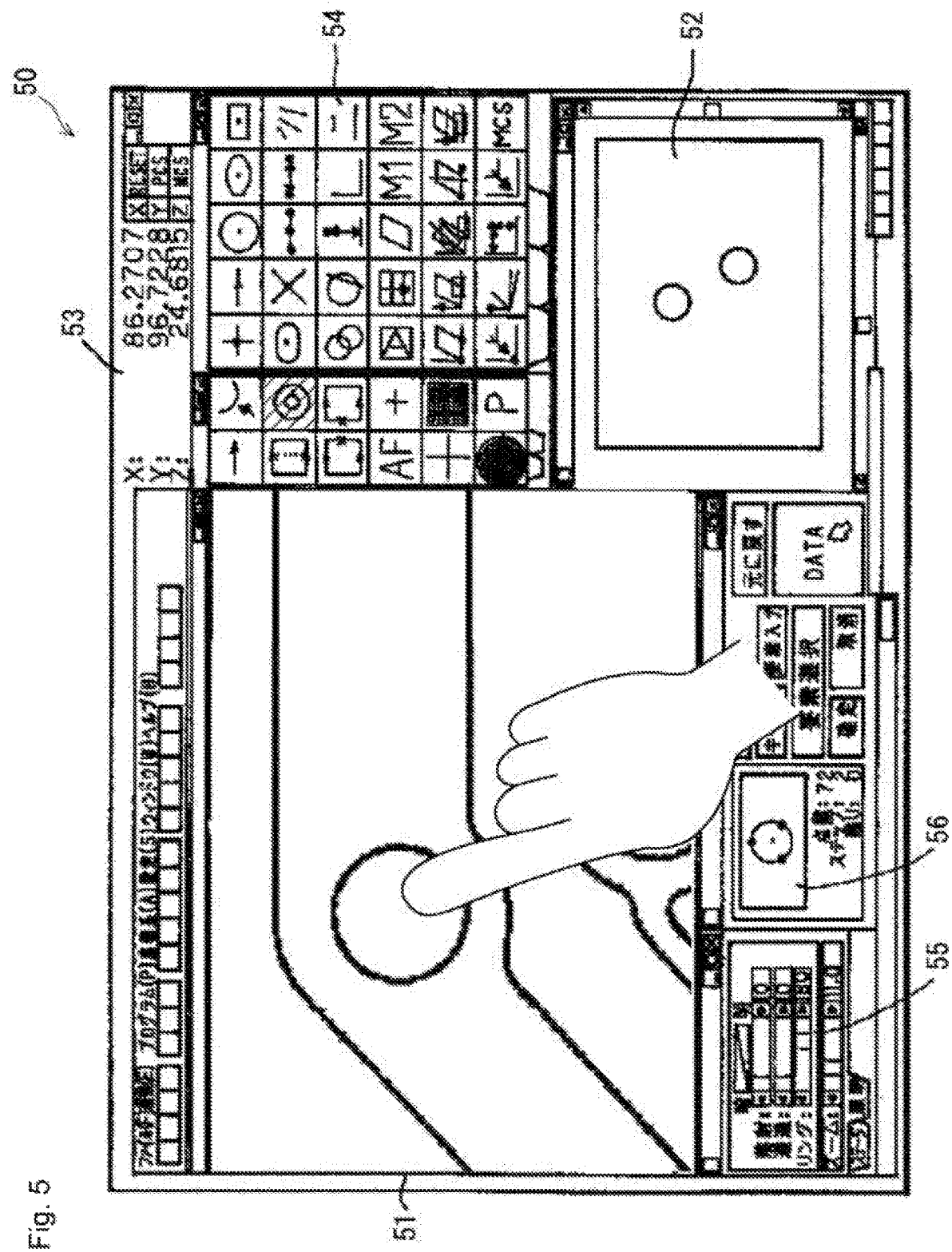
FIG. 5 illustrates target selection as an exemplary input operation.

When the circular range tool (icon 110) has been selected, next, a location (the circle C1) where the circular range tool is to be applied is selected in the work piece image. In this example, the user wishes to perform a shape evaluation of the circle C1, and therefore the user taps so as to designate the circle C1 in the work piece image displayed in the main window 51 (FIG. 5). "Tapping so as to designate the circle C1" can be understood to mean that the user taps on a location somewhat proximate to the circle C1. Fine adjustment can be made later to the region indicated by the circular range tool, and so at this juncture there is no need to strictly determine the tap position and no need for excessive concern. The circular range tool indicates a range using double concentric circles. For example, when configured such that double circles are displayed centered on a coordinate that was tapped, the user may tap near the center of the circle C1.

Figure 6:
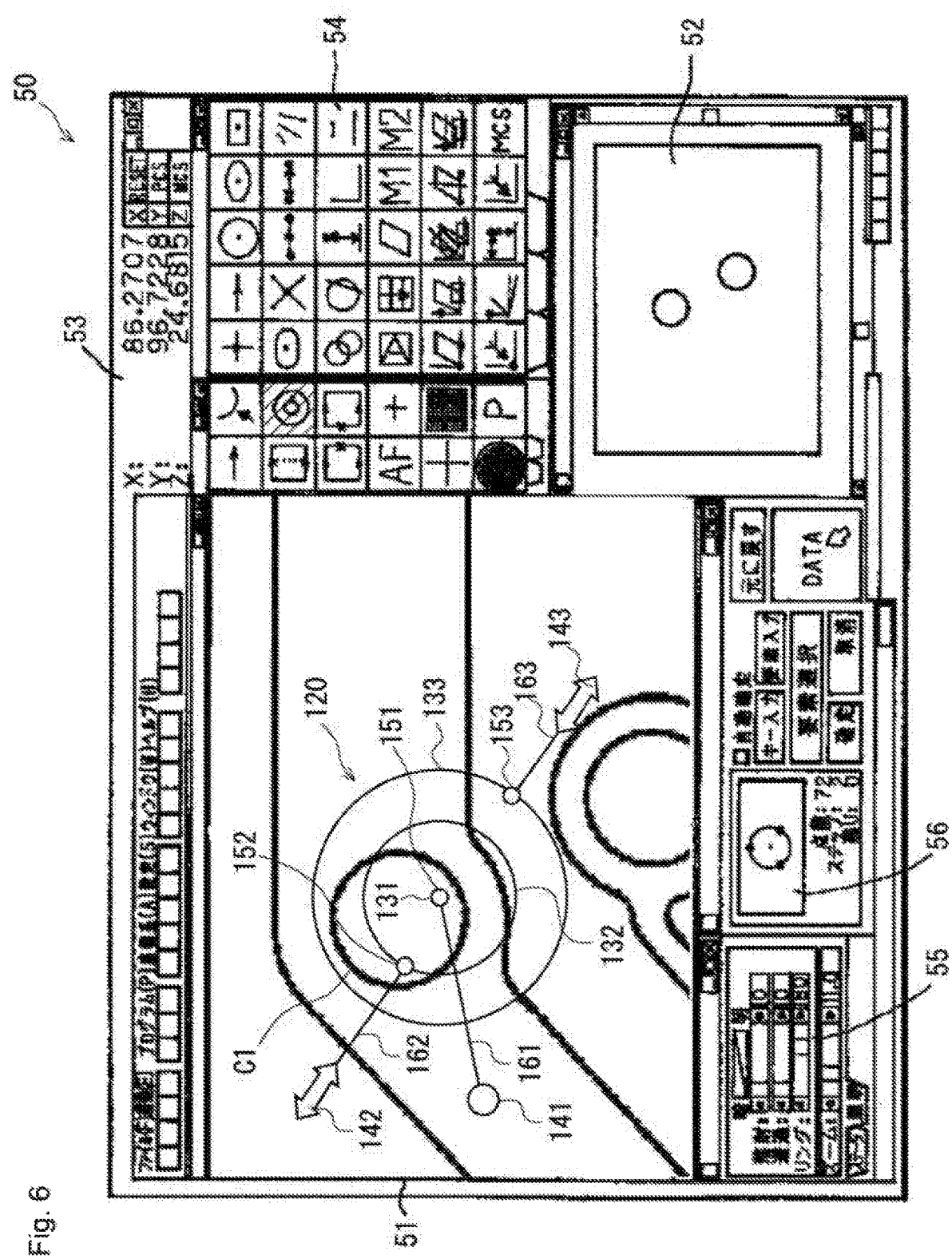
FIG. 6 illustrates a screen on which a circular range tool is displayed.

FIG. 6 illustrates a screen on which a circular range tool 120 is displayed in the main window 51. The circular range tool 120 is displayed superimposed on the work piece image in the main window 51. The circular range tool 120 is primarily double concentric circles. However, focus is now directed to the addition of handles 141, 142, and 143 so as to facilitate manipulation on the touch screen display 24.

Figure 10:
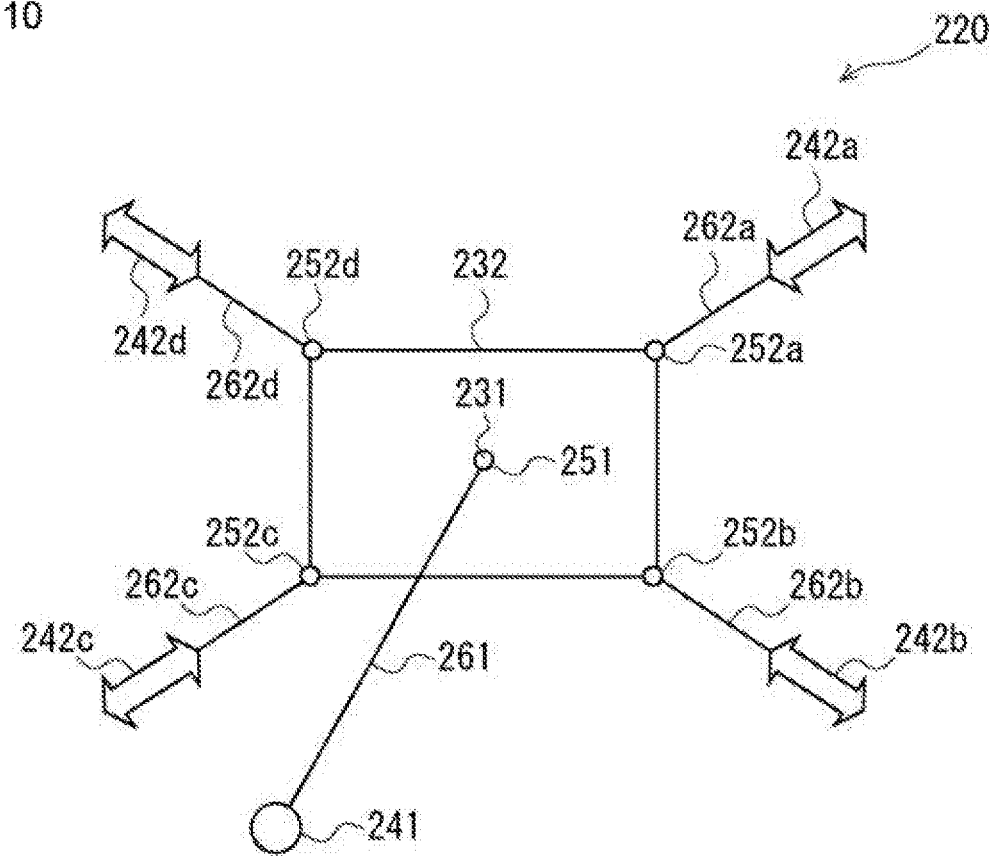
FIG. 10 illustrates a rectangular range tool.
Figure 11:
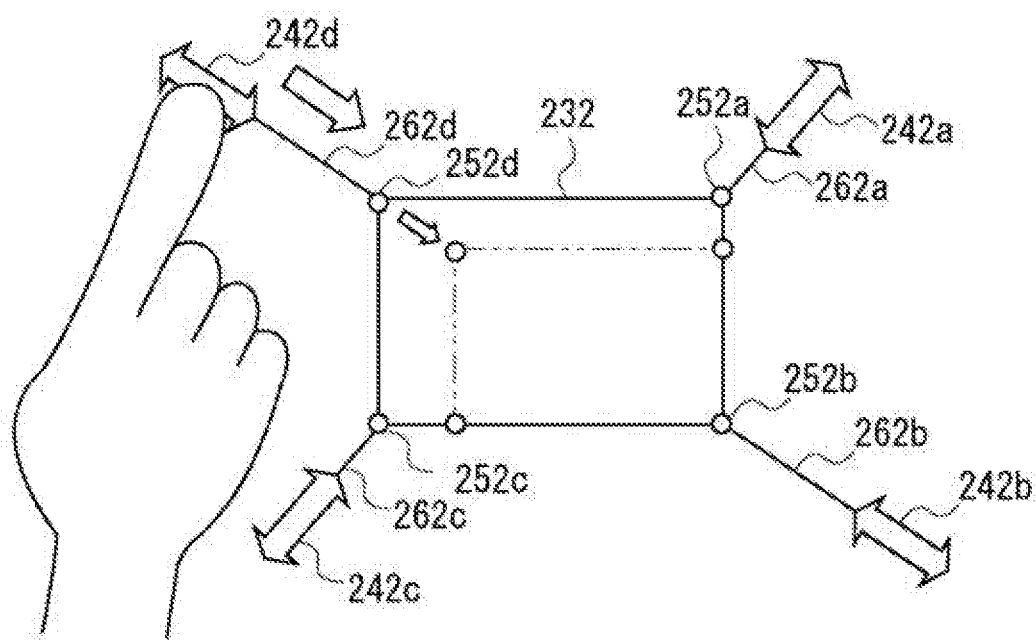
FIG. 11 illustrates an exemplary operation of the rectangular range tool.

The circular range tool is prepared as one type of range tool. In this example, the range tool includes a diagram including one or more parts (also referred to as graphics primitives) (131, 132, and 133) enabling designation of the range; the handles (141, 142, and 143) corresponding to each of the parts (131, 132, and 133) and enabling manipulation of the parts (131, 132, and 133); action points (151, 152, and 153), which are points defined on each of the parts (131, 132, and 133) and activated by operation of the handles (141, 142, and 143); and connecting lines (161, 162, and 163) indicating correspondences between each handle (141, 142, and 143) and each action point (151, 152, and 153). It is noted that the handles (141, 142, and 143) described above are in plural; however, it is contemplated that a single handle may be used. For example, when using a plus "+" shaped cursor, the handle may be a single handle. Further, it is not required that the handles have a one-to-one correspondence relationship with the parts of the diagram. For example, FIG. 10 shows four handles 242a, 242b, 242c, 242d in use with a single part 232 of a diagram. Additionally, a single handle may act on a plurality of parts of a diagram. For example, in FIG. 14, the handle 352 changes the shapes of the parts 320, 330 and moves the part 350.

Referring back to FIG. 6, using the example of the circular range tool 120, the circular range tool 120 includes a single center point 131, an inner circle 132, and an outer circle 133 as parts of the diagram. The inner circle 132 and the outer circle 133 are concentric circles. Although the "center point 131" may be termed herein as "a graphics primitive," such terminology is due to issues of naming conventions and conceptual summaries; a center point is not inherently a graphics primitive, which is why the parts of the diagram are also referred to hereinafter as "parts." As noted hereafter, in a case where the user wishes to shift the entire circular range tool 120, this is more intuitively and readily understood with graphics primitives corresponding to the "entire" circular range tool 120. Therefore, the center point 131 has been introduced as a graphics primitive merely to provide a graphics primitive corresponding to the "entire" circular range tool 120. More directly, an element representing the "entirety" may also be introduced. Should an element representing the "entirety" be introduced, the entirety may be represented by the center point or, alternatively, a rectangle enclosing the entirety may be drawn outside the outer circle 133 and this rectangle may correspond to the "entirety."

A region between the inner circle 132 and the outer circle 133 forms the (evaluation) region designated by the circular range tool 120. Accordingly, the user makes fine corrections to the position and size of the circular range tool 120 so as to include (an outline of) the circle C1, which is the object to be evaluated, between the inner circle 132 and the outer circle 133. It goes without saying that no line other than the circle C1 must be allowed within the circular range tool. Different outlines are present quite close to the circle C1, but the positions and sizes of the inner circle 132 and the outer circle 133 must be adjusted such that these lines are not included. In a case where the work piece has a complex shape, the circle C1 (which is the object to be evaluated) and other lines may occasionally be extremely close to one another, requiring fine input control on the pixel level.

Next, the handles 141, 142, and 143; the action points 151, 152, and 153; and the connecting lines 161, 162, and 163 are described. The circular range tool 120 includes three handles 141, 142, and 143 as the handles. Although these designations are not of critical importance, for ease of description, they have been respectively designated as the center point handle 141, the inner circle handle 142, and the outer circle handle 143. The handles 141, 142, and 143 are displayed in positions slightly apart from the parts 131, 132, and 133.

Figure 8:
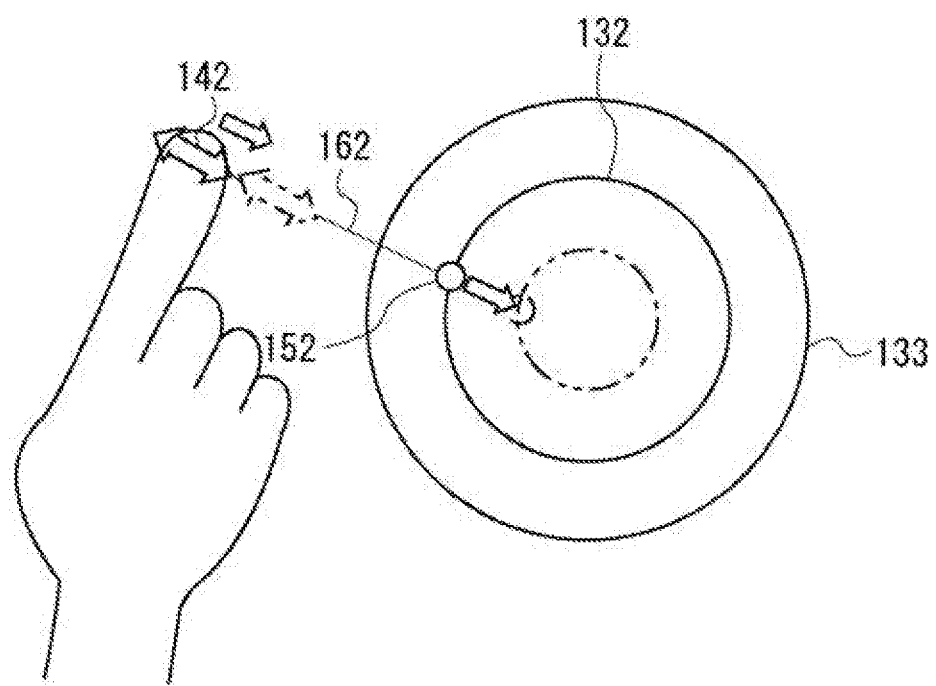
FIG. 8 illustrates an operation to reduce a diameter.

In addition, three action points 151, 152, and 153 are defined by the circular range tool 120. The action points 151, 152, and 153 are defined so as to lie on the lines of the respective parts 131, 132, and 133 or so as to be in contact with the lines of the respective parts. Although these designations are not of critical importance, they have been respectively designated as the center point action point 151, the inner circle action point 152, and the outer circle action point 153. It is noted that the action point is not necessarily enhanced as a small circle. For example, the small circles in FIG. 12 (252a, 252b, 252c, 252d) do not have to be displayed. A handle that does not have an action point is also contemplated. For example, a handle for parallel movement/rotation movement/enlarging-minimizing of the entire graphics structure may have an action point near the graphic center for convenience, or it may not have any action point. It is further contemplated that a handle will have a plurality of action points. For example, in FIG. 8, the handle may change each radius of parts 132 and 133 in conjunction, so the action points for this handle are provided to each of parts 132 and 133. Accordingly, depending on the particular application, a handle for one input support tool may have no action point, one action point, or a plurality of action points.

Referring back to FIG. 6, the connecting lines 161, 162, and 163 are lines connecting each of the handles 141, 142, and 143 to the respective action point 151, 152, and 153. The line linking the center point handle 141 with the center point action point 151 is designated as the center point connecting line 161. The line linking the inner circle handle 142 with the inner circle action point 152 is designated as the inner circle connecting line 162. The line linking the outer circle handle 143 with the outer circle action point 153 is designated as the outer circle connecting line 163. In a specific sense, a connecting line connects an action point and a handle; however, in some embodiments, some of the connecting lines may be omitted. For example, connecting lines 262a, 262b, 262c, 262d of FIG. 12 may not need to be present, since the relationship of the handle and action point is readily understood from the relative positions. Therefore, some or all of the action points may have connecting lines. In a generic sense, there need not be a direct or physical connection between the action point and a handle on the display, but may rather indicate a correspondence relationship between the action point and handle.

When the inner circle 132 and the outer circle 133 are concentric circles, the center point action point 151 is defined as the center point 131 of both. The center point action point 151 is represented by an extremely small circular icon to facilitate recognition that the icon corresponds to the center point of the circles. When the center point action point 151 is displaced, the inner circle 132 and the outer circle 133 are configured to displace with it in the same manner. In other words, the center point action point 151 is an action point enabling displacement of the entire circular range tool. In addition, the center point connecting line 161 extends from the center point action point 151 and the center point handle 141 is defined at an end of the center point connecting line 161. The center point handle 141 is a slightly larger circular icon to facilitate tapping with a finger. When a finger is rested on the center point handle 141 and dragged, the center point handle 141 displaces together with the finger. However, in addition, the center point action point 151 also displaces together with the center point handle 141. In other words, as shown by an example in FIG. 7, the center point handle 141 and the center point action point 151 displace as one, and the entire circular range tool displaces in parallel accompanying displacement of the center point action point 151.

Figure 7:
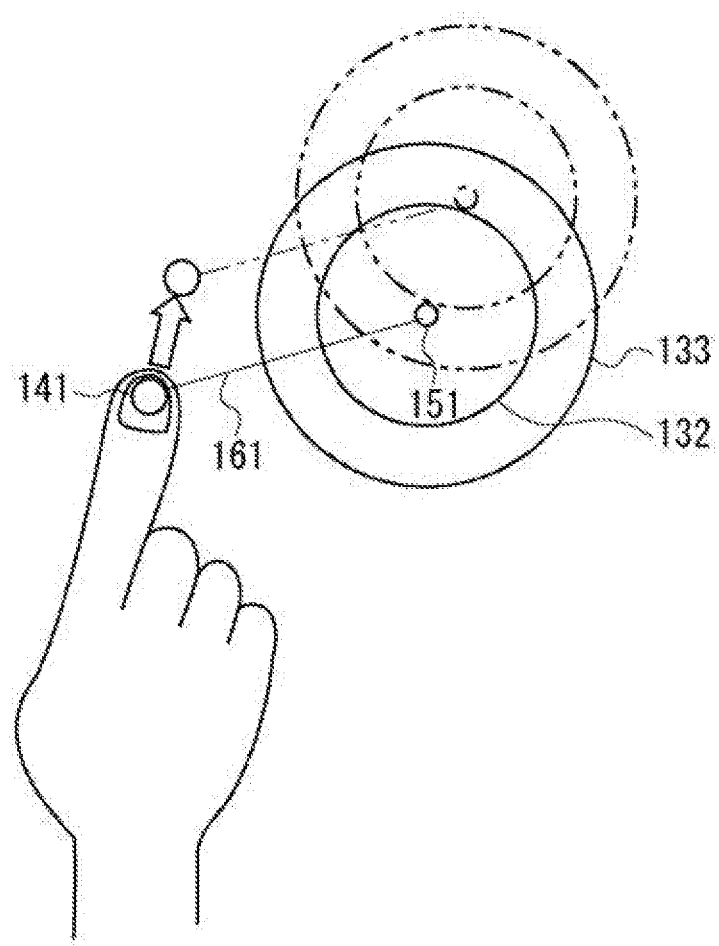
FIG. 7 illustrates an exemplary parallel displacement of the circular range tool.

In FIG. 7, depictions of the inner circle handle 142, the inner circle action point 152, the inner circle connecting line 162, the outer circle handle 143, the outer circle action point 153, and the outer circle connecting line 163 are omitted. This is to facilitate viewing of the figure, but displays of these elements may also be configured to temporarily disappear when a finger is detected pressing the center point handle 141 on an actual display screen. By eliminating unnecessary display elements, operability can be improved.

The inner circle action point 152 is defined on a line of the inner circle 132 and is represented by a small circular icon. The inner circle action point 152 is displaced in a diameter direction of the inner circle 132, and a radius of the inner circle 132 increases or decreases in size accompanying displacement of the inner circle action point 152. The inner circle connecting line 162 extends from the inner circle action point 152 in the diameter direction and the inner circle handle 142 is defined at an end of the inner circle connecting line 162. The inner circle handle 142 is a slightly larger icon to facilitate tapping with a finger, but the icon has the shape of a diameter direction, two-way arrow. The user rests a finger on the inner circle handle 142 and drags, but displacement of the inner circle handle 142 is restricted to the diameter direction. At this point, the user recognizes the "diameter direction" in which the inner circle handle 142 can be moved due to the direction of the inner circle connecting line 162 and the orientation of the arrow of the inner circle handle 142. When a finger is rested on the inner circle handle 142 and dragged, the inner circle handle 142 displaces together with the finger. However, in addition, the inner circle action point 152 also displaces together with the inner circle handle 142. As shown by an example in FIG. 8, the inner circle handle 142 and the inner circle action point 152 displace as one, and the diameter of the inner circle 132 becomes larger and smaller accompanying displacement of the inner circle action point 152.

The outer circle action point 153, the outer circle handle 143, and the outer circle connecting line 163 are similar to the case of the inner circle 132, and thus descriptions thereof are omitted.

Figure 9:
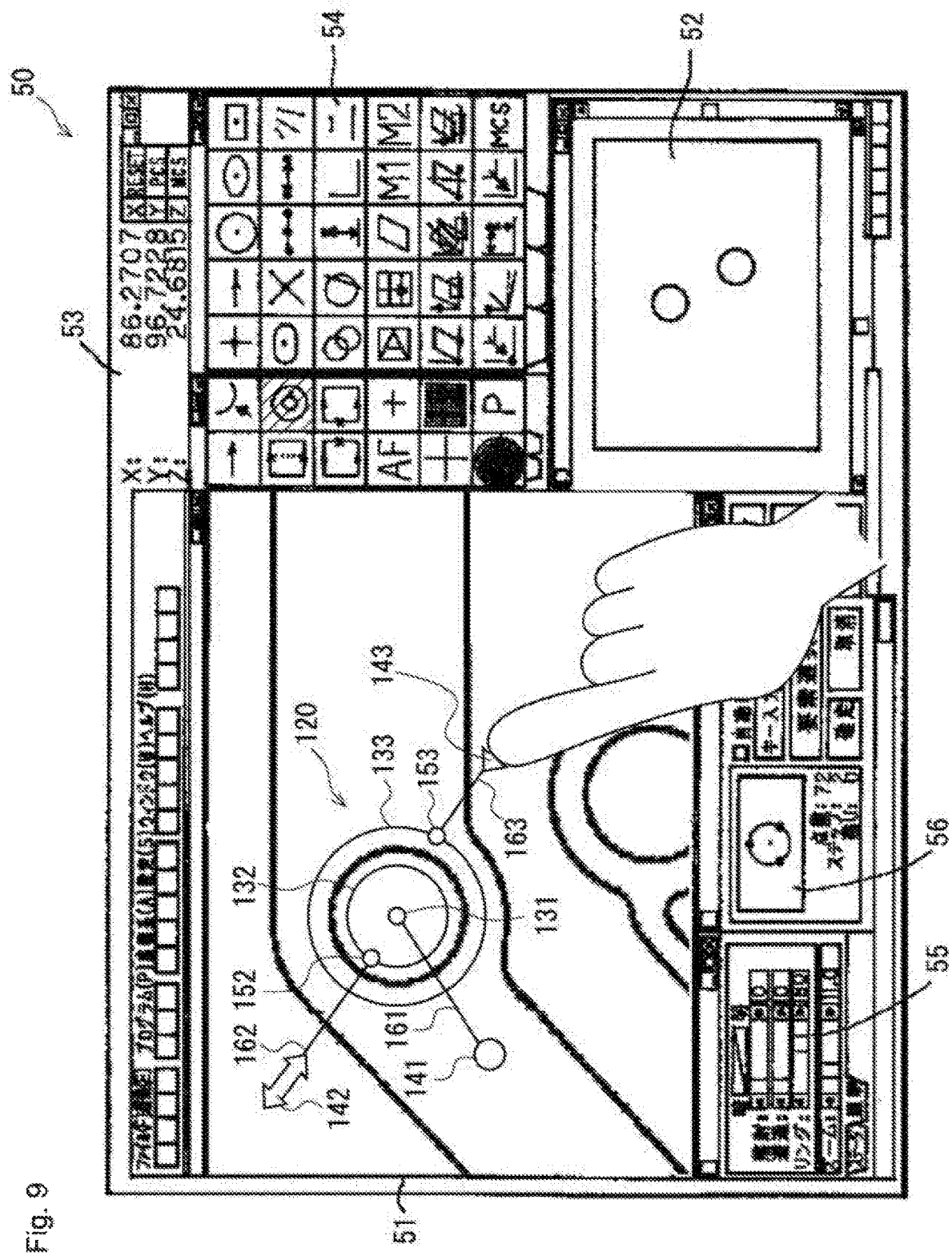
FIG. 9 illustrates an exemplary state in which adjustment of the circular range tool has ended.

Using the center point handle 141, the inner circle handle 142, and the outer circle handle 143, the center point 131 can be displaced to substantially the center of the circle C1 and, moreover, the radii of the inner circle 132 and the outer circle 133 can be adjusted such that the circle C1 is between the inner circle 132 and the outer circle 133 (FIG. 9).

In addition to the circular range tool 120, other range tools may be prepared such as a rectangular range tool 220 and an arc range tool 300. Simplified examples of these variations are provided below.

Rectangular Range Tool

FIG. 10 illustrates the rectangular range tool 220. The rectangular range tool 220 includes a center point 231 and a rectangle 232 as parts of a diagram, and the center point 231 is defined with an action point 251 while each vertex of the rectangle 232 is defined with an action point 252a, 252b, 252c, and 252d, respectively. In addition, connecting lines 261, 262a, 262b, 262c, and 262d extend from each of the action points 251, 252a, 252b, 252c, and 252d, respectively. Handles 241, 242a, 242b, 242c, and 242d corresponding to each of the action points 251, 252a, 252b, 252c, and 252d, respectively, are defined at an end of each of the connecting lines 261, 262a, 262b, 262c, and 262d, respectively. The center point handle 241 manipulating the center point action point 251 can be moved in any direction. Also, the vertex handles 242a, 242b, 242c, and 242d manipulating the vertex action points 252a, 252b, 252c, and 252d can displace in any direction so as to preserve the rectangular shape of the rectangle 232. Accordingly, in a case where the vertex handles 242a, 242b, 242c, and 242d (vertex action points 252a, 252b, 252c, and 252d) are displaced, the size of the rectangle 232 can change, and a ratio of a vertical side of the rectangle 232 to a horizontal side of the rectangle 232 can also change.

In addition, instead of the vertex handles 242a, 242b, 242c, and 242d, action points may be defined at each side of the rectangle 232, connecting lines may extend from each action point, and handles (referred to as side handles) may be defined at an end of the connecting lines. In such a case, when the displacement direction of the side handle is a direction perpendicular to the side, effects are equivalent to the above-described case providing vertex handles.

Figure 12:
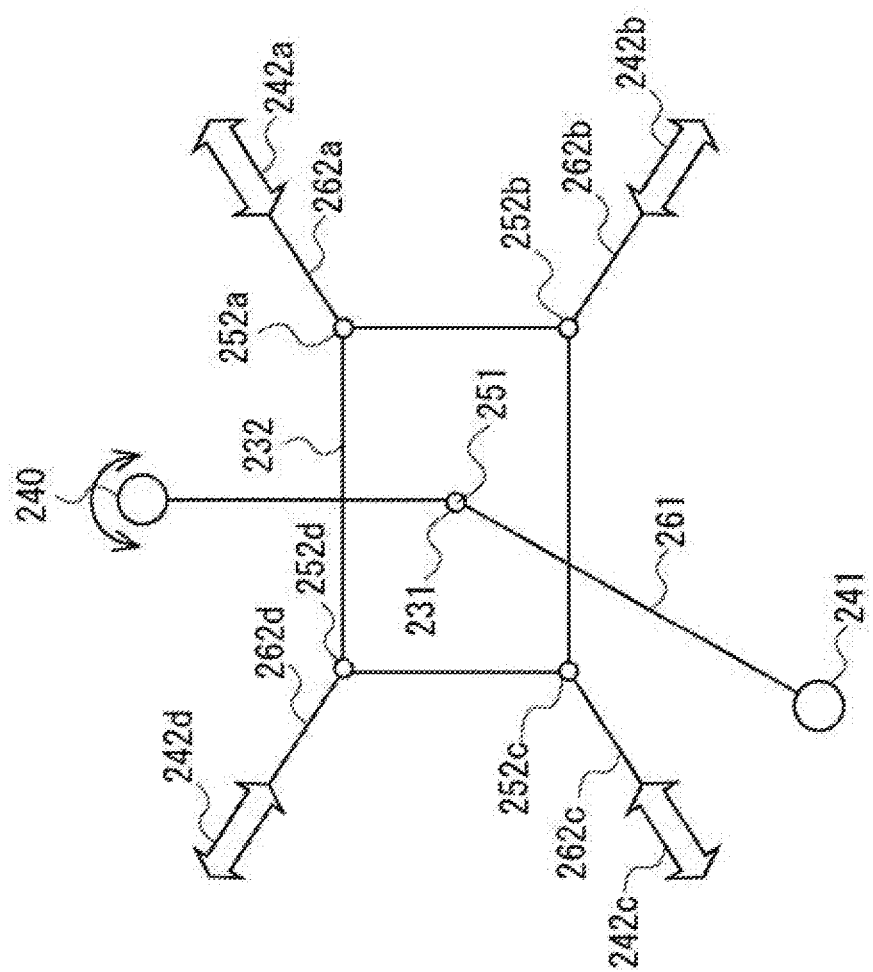
FIG. 12 illustrates an exemplary rotation handle.
Figure 13:
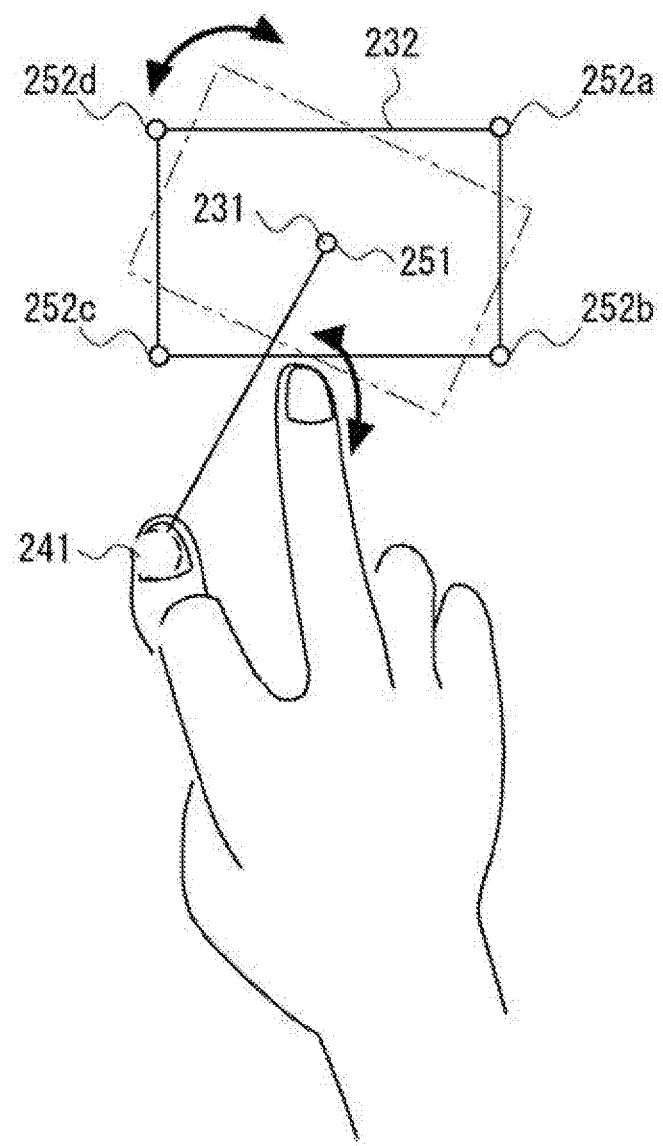
FIG. 13 illustrates an exemplary rotation operation using multi-touch.

In the case of the rectangular range tool 220, "rotation" may be necessary. In such a situation, as shown in FIG. 12 for example, a dedicated rotation operation handle (rotation handle) 240 may be provided. Alternatively, the center point handle 241 may double as the rotation handle and, as shown in FIG. 13 for example, may be configured to perform a rotation operation with a multi-touch. For example, the user rests the index finger on the center point handle 241 and then rests the middle finger on the touch screen display 24. Once the touch screen display 24 detects the multi-touch in a state where the center point handle 241 is pressed, the touch screen display 24 recognizes that the multi-touch is a rotation operation. By shifting the position of the middle finger forward and backward, a rotation operation is input with rotation centered on the center action point 251 (center point 231).

Figure 14:
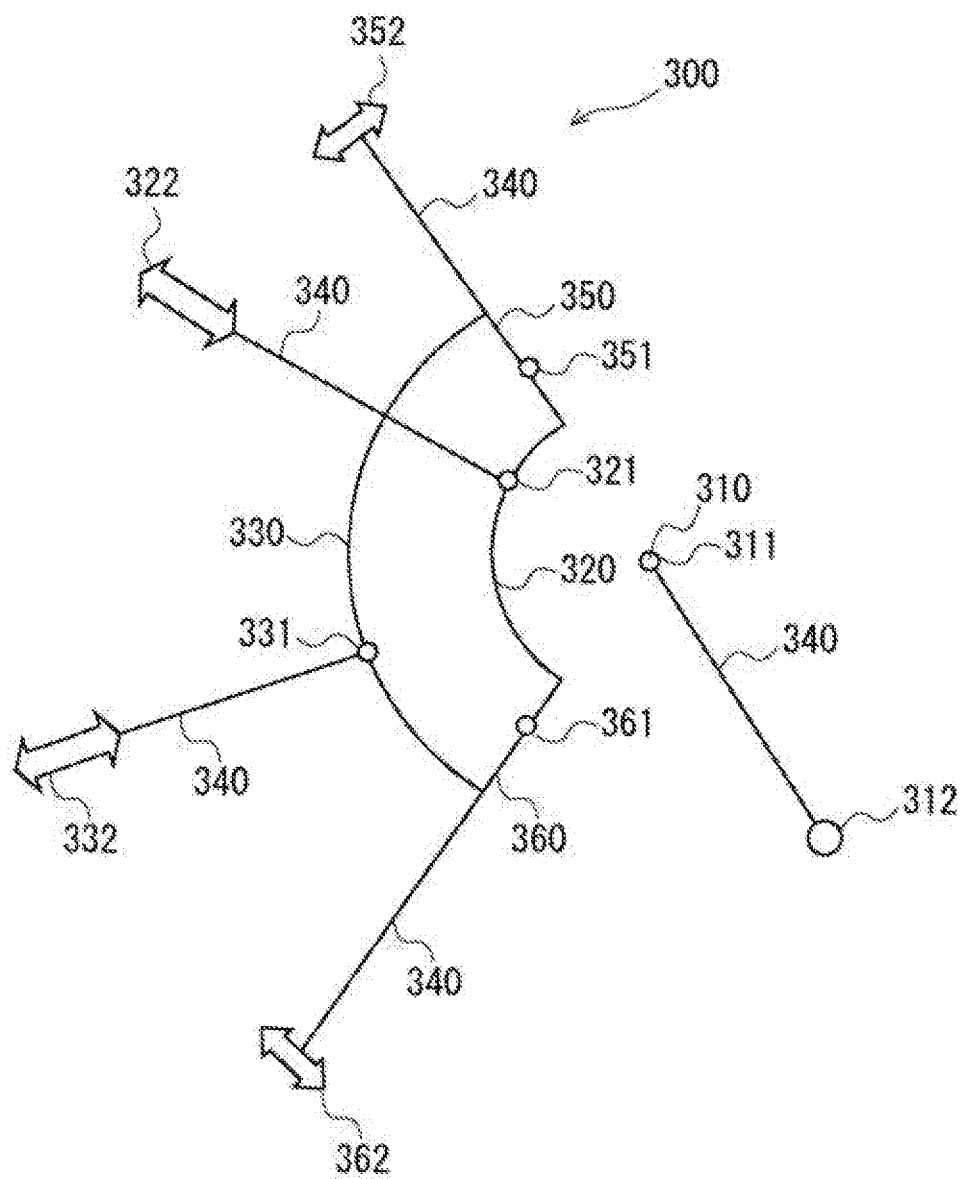
FIG. 14 illustrates an exemplary arc range tool.

Arc Range Tool Another example is now described. FIG. 14 illustrates the arc range tool 300. The arc range tool 300 indicates a region between an inner arc 320 and an outer arc 330. The action points and handles required for the arc range tool 300 are fundamentally similar to those described up to this point for the circular range tool 120 and the rectangular range tool 220. Describing displacement of the center point 310, rotation, adjustment of the radius of the inner arc 320, adjustment of the radius of the outer arc 330, and the like would be duplicative, and therefore such descriptions are omitted.

A handle that is characteristic of the arc range tool 300 is a handle enabling adjustment of a center angle of the arc. In other words, handles 352 and 362 are required which adjust the positions of two tracks 350 and 360. Action points 351 and 361 are defined on the tracks 350 and 360, and connecting lines 340 extend in the diameter direction from the action points 351 and 361. The handles 352 and 362 are defined at ends of the respective connecting lines 340. In order to facilitate recognition of a direction in which displacement can be performed, an icon shape for the handles 352 and 362 may be a two-way arrow orthogonal to the connecting lines 340, and more preferably may be somewhat curved in an arc shape.

Supplementing Effects of the Invention

One characteristic of the present embodiment is to provide a handle enabling manipulation of an action point. The handle is moved away from the part via the connecting line and is configured such that the handle does not overlap with the part. In this example, the action point is considered to be designated as the handle, and in a GUI predicated on use of a mouse cursor, this is in fact the case. In addition, a point to be moved acts as the handle even in existing products predicated on use of a touch screen display, and a handle is not expressly provided moved away from the action point. In the present embodiment, the handle is expressly provided moved away from the action point because an extremely fine designation range, on the pixel level, has become critical.

Figure 15:
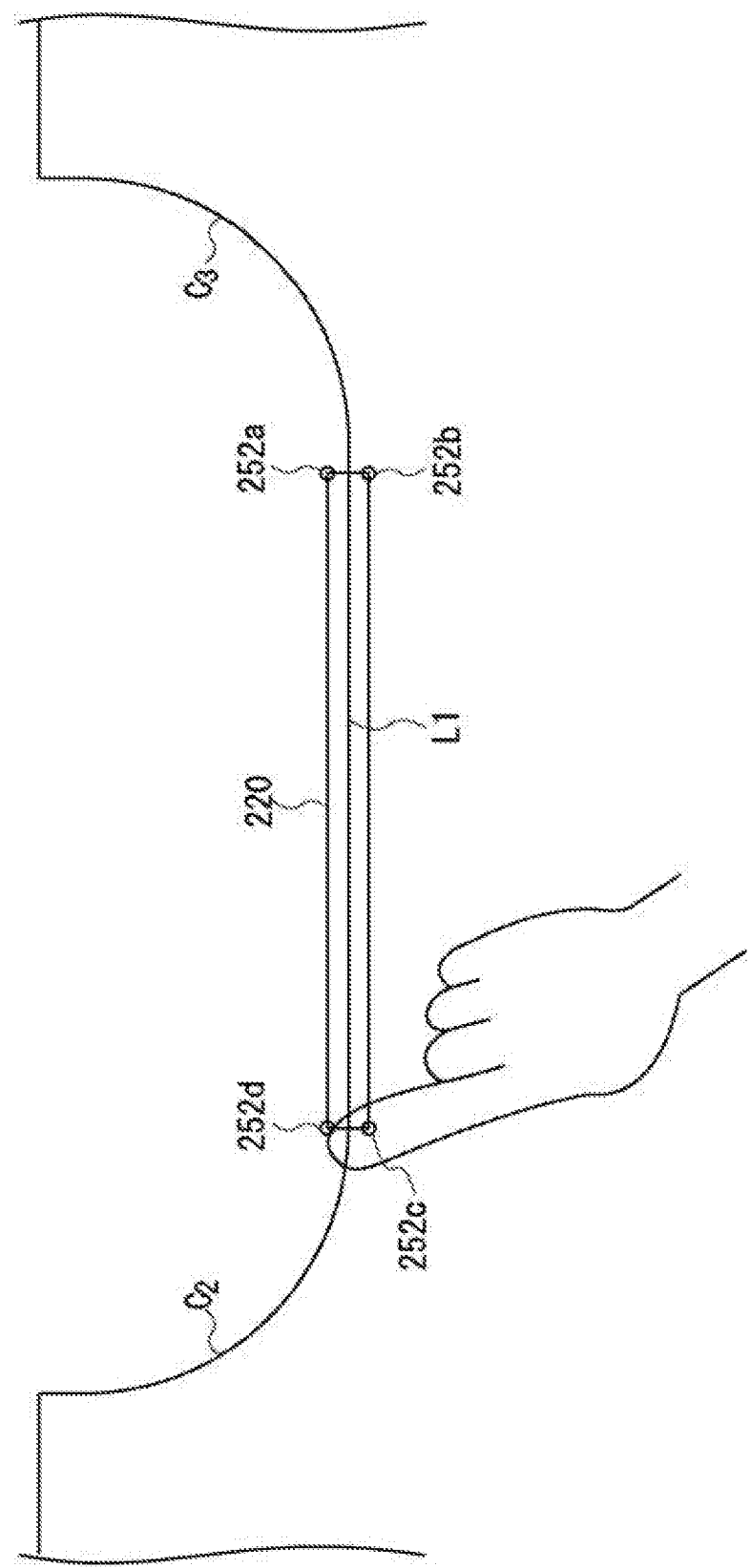
FIG. 15 illustrates a contrasting example illustrating an effect of the embodiment.

An example follows. As shown in FIG. 15, a straight line portion L1 is linked at two ends to arcs C2 and C3, and a degree of straightness of the straight line portion L1 is to be evaluated. The straight line L1 should be surrounded by the rectangular range tool 220, but the element to be evaluated (here, the straight line L1) must be accurately enclosed, without cutting off the element or including any other element. For example, when the range indicated by the rectangular range tool 220 is too narrow, this is detrimental. In such a case, there is a possibility of outputting a degree of straightness that is higher than the actual straightness. Naturally, when the range indicated by the rectangular range tool 220 is too broad, this is also detrimental. In such a case, the range may include the arcs C2 and C3 and may output a degree of straightness that is lower than the actual straightness. In order to correctly evaluate the work piece (measured object), the element to be evaluated (in this example, the straight line L1) must be accurately enclosed, without cutting off the element or including any other element, on the pixel level. However, as shown in the example of FIG. 15, when the user presses the action point 252c with a finger, a boundary between the straight line L1 and the arcs C2 and C3 may be obscured by the finger. The user may move the action point 252c slightly, then remove the finger to check the position, then make a further fine adjustment, then remove the finger and check the position again. However, this is troublesome and presents a difficult task in accurately matching the boundary of the rectangular range tool 220 to a point the user cannot see. As used herein, "movement" of the diagram or part is not limited to any particular type of movement, but rather includes, but is not limited to, displacement (rotation/parallel movement, or a combination of both), expansion, reduction, deformation and the like.

Figure 16:
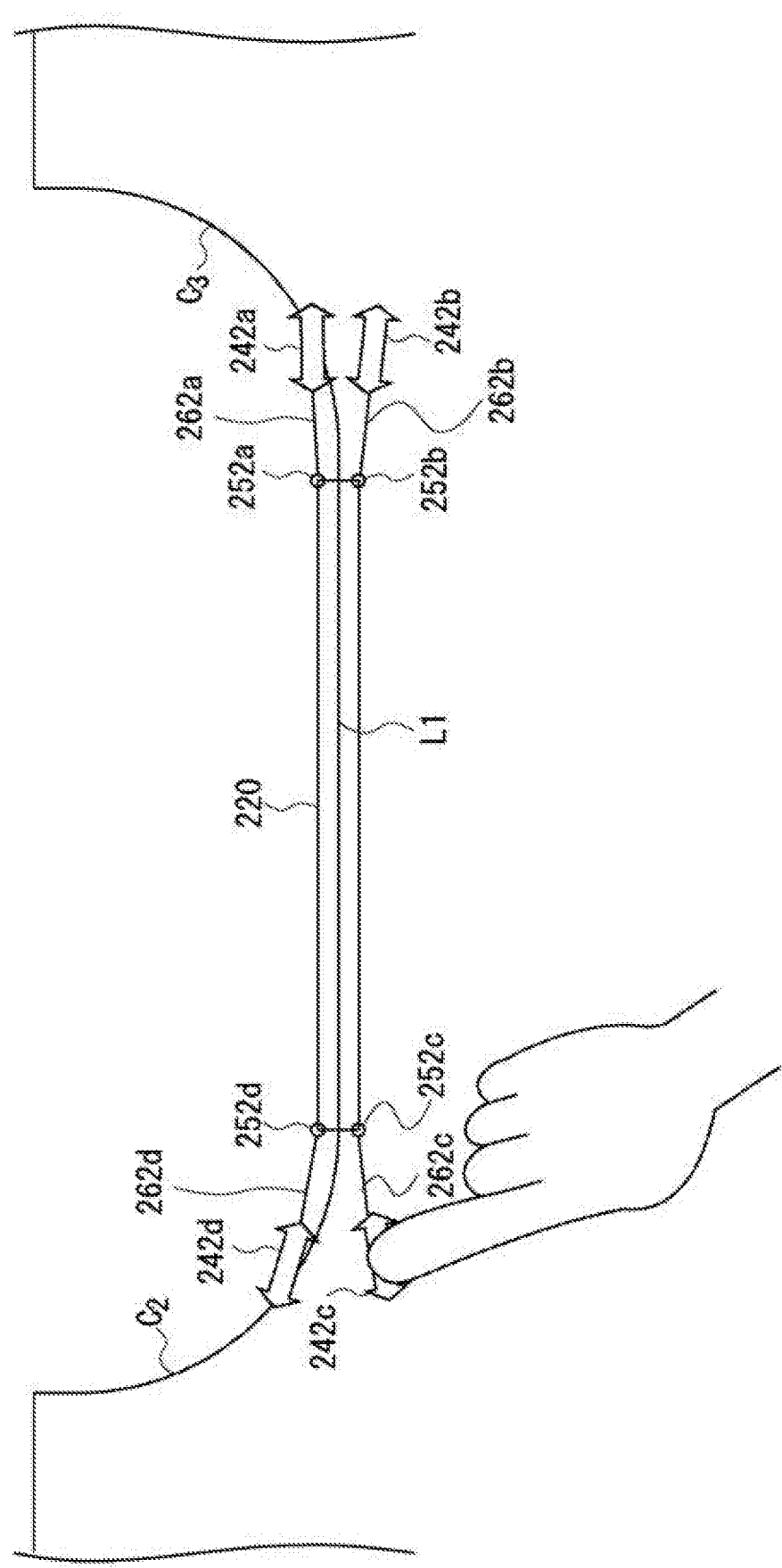
FIG. 16 illustrates the effect of the embodiment.

In this regard, as shown in FIG. 16, use of the handle 242c facilitates the task.

Other Embodiments

In the above description, an example was given of an embodiment having an action point, a connecting line, and a handle as graphic input support tools, but this is merely exemplary. Specifically, so long as at least the handle is displayed as an input support tool, the user can use the handle to manipulate a part. For example, the user can favorably execute parallel displacement of a part, enlargement or shrinking of a radius of a circle, increase or decrease of curvature of an arc, and the like.

When the user operates the handle with a finger, an amount that the finger moves and amount of movement of the part (action point) can be set to a predetermined ratio (referred to as a displacement ratio). For example, each time the user's finger moves 3 pixels on the touch screen display, the part can be controlled so as to move 1 pixel. In such a case, movement of the part can be precisely controlled. In addition, a configuration is also possible in which the more time that passes after the user's finger touches the handle, the larger or smaller the displacement ratio grows. Furthermore, a configuration is also possible in which the displacement ratio grows larger or smaller the greater the strength with which the user touches the handle (pressing force).

When the user operates the handle with a finger, the user can also enlarge the display (for example, to double size) of the input support tool (the handle being operated, the corresponding connecting line, and the action point; this may also include enlargement of the part being manipulated). At this point, as with the vertex handles, in cases where the action points are clearly recognizable, a handle may be displayed on the action point of the input support tool which has been enlarged. In addition, by operating the handle, the enlarged input support tool can be deformed and displaced. Moreover, by defining the center of the enlarged display of the input support tool (a point serving as reference for the enlarged display, or a center of similarity) as the center of the input support tool, operation of the input support tool can be facilitated. The center of the enlarged display of the input support tool (the point serving as reference for the enlarged display, or the center of similarity) may be displayed on the screen, or not displayed.

Figure 17:
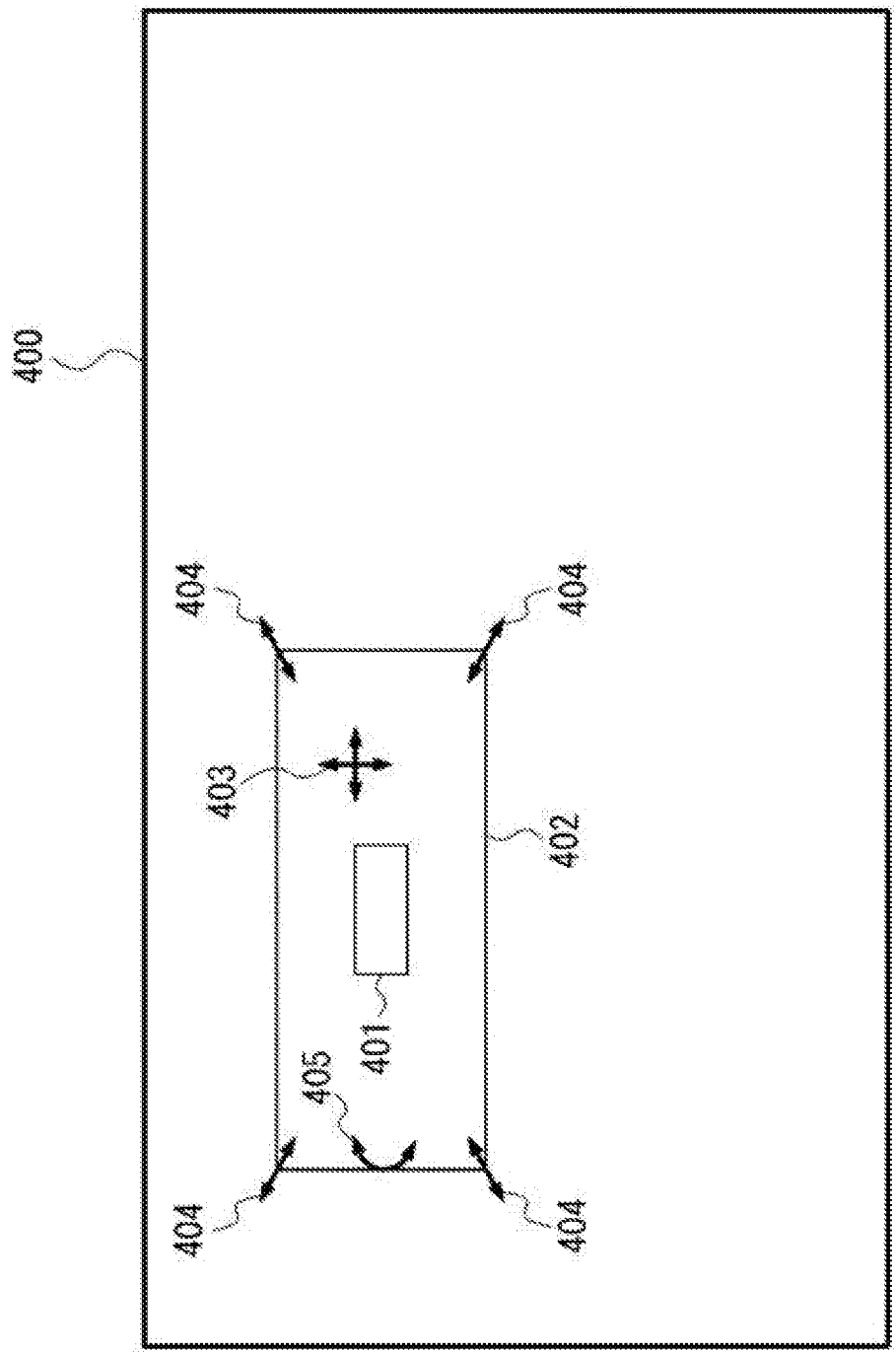
FIG. 17 illustrates a first example displaying an enlarged input support tool for a rectangle.

FIG. 17 illustrates an example in which an enlarged input support tool for a rectangle is displayed. In this example, as shown in FIG. 17, a rectangle 401 is displayed within the screen 400. However, when the display dimensions of the rectangle 401 are small, the user will have difficulty operating the handles even when the handles are displayed on the rectangle 401. Therefore, a rectangle 402 is displayed, which is the rectangle 401 enlarged. A displacement handle 403 displacing the input support tool up, down, left, and right is displayed on an interior of the rectangle 402. Vertex handles 404 displacing each vertex of the rectangle 402 are displayed on the four vertices of the rectangle 402. A rotation handle 405 rotating the input support tool is displayed on the left edge of the rectangle 402. Accordingly, even in a case where the display dimensions of the part to be manipulated are small, the displacement handle 403, the vertex handles 404, and the rotation handle 405 can be displayed at a size enabling easy manipulation. In addition, the displacement handle 403, the vertex handles 404, and the rotation handle 405 can be arranged separated from each other to a degree enabling easy manipulation.

In a case where the input support tool is positioned at an edge of the screen during enlarged display of the input support tool, when the center of the enlarged display of the input support tool (the point serving as reference for the enlarged display, or the center of similarity) is treated as the center of the input support tool, a situation may arise in which the enlarged display does not fit on the screen. In such a case, in order to fit the enlarged display on the screen, the center of the enlarged display of the input support tool (the point serving as reference for the enlarged display, or the center of similarity) may be a point other than the center of the input support tool. The center of the enlarged display of the input support tool (the point serving as reference for the enlarged display, or the center of similarity) may be outside the input support tool or may be outside the screen. In a case where the original, unenlarged input support tool is outside the enlarged display of the input support tool, a connecting line may also be displayed which indicates the correlation of the original, unenlarged input support tool to the enlarged display.

Figure 18:
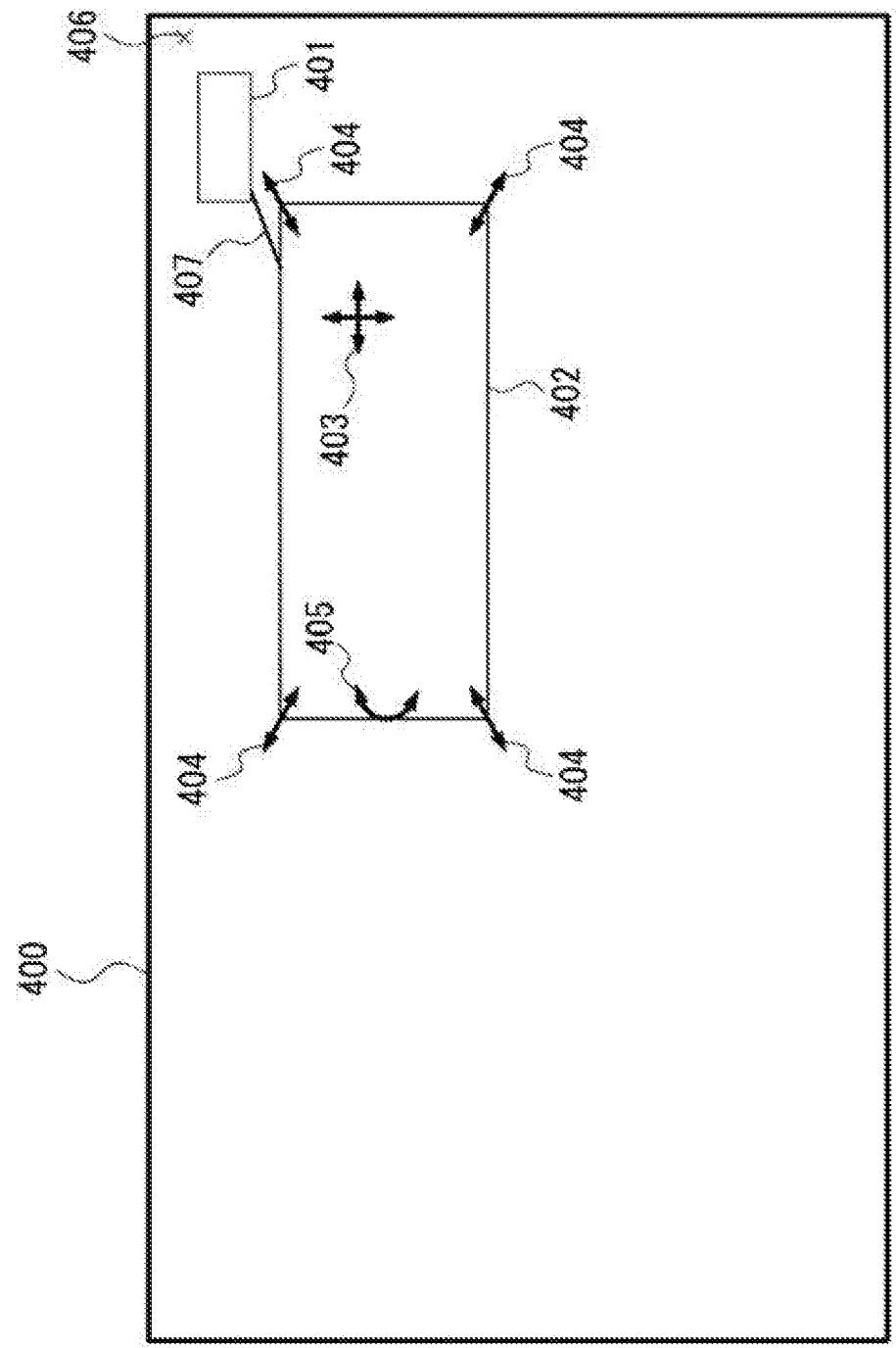
FIG. 18 illustrates a second example displaying an enlarged input support tool for a rectangle.

FIG. 18 illustrates another example in which an enlarged input support tool for a rectangle is displayed. In this example, as shown in FIG. 18, a rectangle 401 is displayed near a top right within the screen 400. Similar to the example shown in FIG. 17, when the display dimensions of the rectangle 401 are small, the user will have difficulty operating the handles even when the handles are displayed on the rectangle 401. Therefore, the rectangle 402 is displayed, which is the rectangle 401 enlarged. However, when the center of the rectangle 401 is treated as the center of the enlarged display, the enlarged rectangle overflows outside the screen 400. In this example, the rectangle 402 is displayed outside and to the lower left of the rectangle 401, the rectangle 402 being enlarged with an enlargement center point 406, a point outside the rectangle 401, as a reference. In addition, in order to clarify that the rectangle 402 is the enlarged display of the rectangle 401, a connecting line 407 links the rectangle 401 and the rectangle 402. The displacement handle 403, the vertex handles 404, and the rotation handle 405 of FIG. 18 are similar to those exemplified in FIG. 17 and descriptions thereof are therefore omitted. Accordingly, even in a case where the display dimensions of the part to be manipulated are small and the part is displayed near an edge of the screen, the displacement handle 403, the vertex handles 404, and the rotation handle 405 can be displayed at a size enabling easy manipulation. In addition, the displacement handle 403, the vertex handles 404, and the rotation handle 405 can be arranged separated from each other to a degree enabling easy manipulation. It is noted that the term "link" as used herein need not be a direct or physical connection between the action point and a handle on the display, but may rather indicate a correspondence relationship between the action point and handle.

When the original, unenlarged input support tool and the enlarged display are shown superimposed on each other, a situation may arise in which the original, unenlarged input support tool and the enlarged display intersect with each other and visibility is adversely affected. In such a case, a point other than the center of the input support tool can be used as the center of the enlarged display of the input support tool (the point serving as reference for the enlarged display, or the center of similarity), and the enlarged display can be displayed outside the original, unenlarged input support tool. In such a case, a connecting line may also be displayed which indicates the correlation of the original, unenlarged input support tool to the enlarged display.

Figure 19:
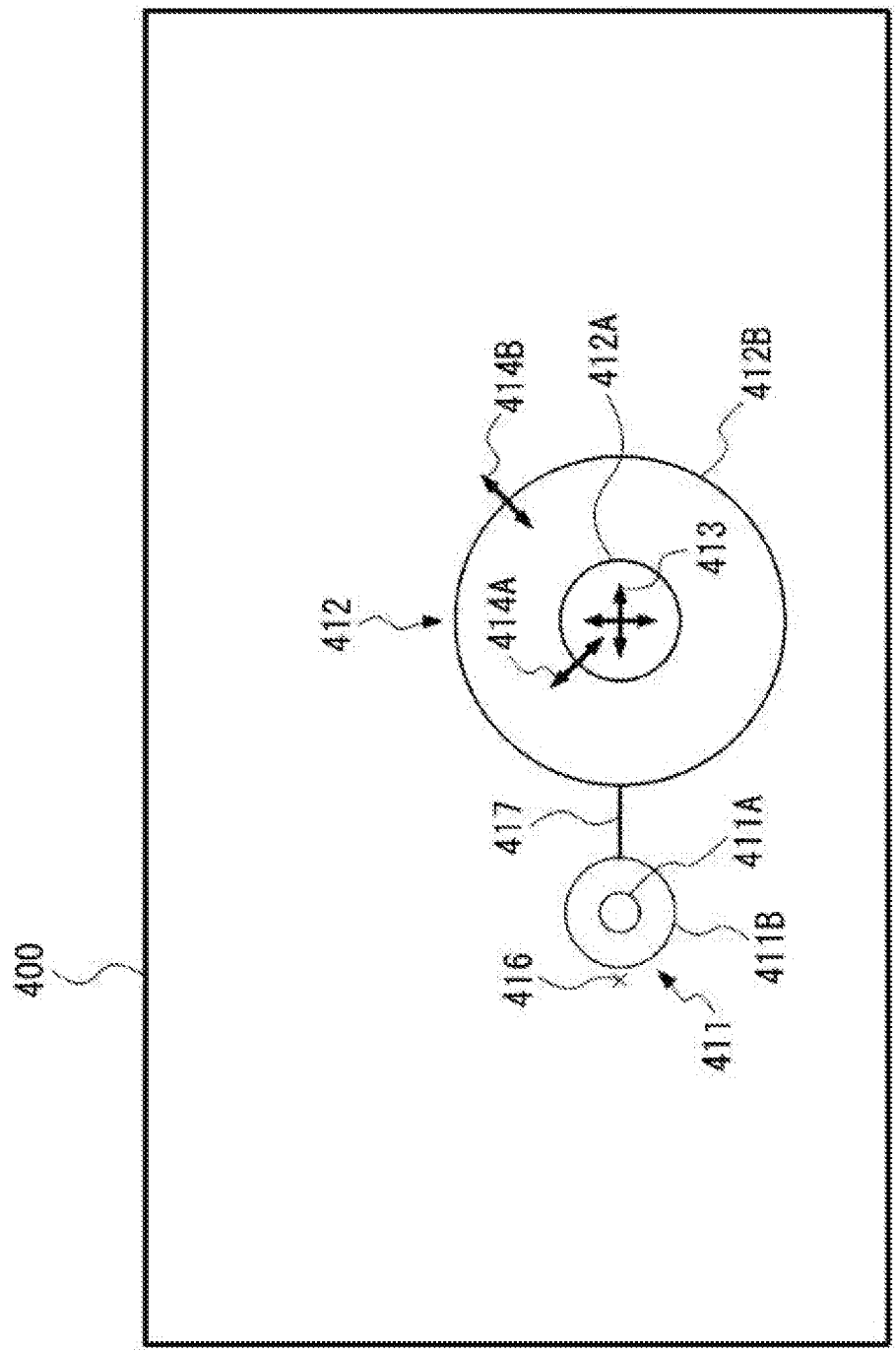
FIG. 19 illustrates an example displaying an enlarged input support tool for concentric circles.

FIG. 19 illustrates an example displaying an enlarged input support tool for concentric circles. In this example, as shown in FIG. 19, concentric circles 411 are displayed in a bottom portion of the screen 400. The concentric circles 411 are configured by an inner circle 411A and an outer circle 411B. When the display dimensions of the concentric circles 411 are small, the user has difficulty operating the handles even when the handles are displayed on the concentric circles 411. Therefore, concentric circles 412 are displayed, which are the concentric circles 411 enlarged. However, when the center of the concentric circles 411 is defined as the center of the enlarged display, the inner circle 411A and the outer circle 411B of the concentric circles 411 overlap with an inner circle 412A and an outer circle 412B of the enlarged concentric circles 412. Therefore, the user has difficulty visually distinguishing the original concentric circles 411 and the enlarged concentric circles 412. In this example, the concentric circles 412 are displayed outside and to the right of the concentric circles 411, the concentric circles 412 being enlarged with an enlargement center point 416, a point outside and to the left of the concentric circles 411, as a reference. In addition, in order to clarify that the concentric circles 412 are the enlarged display of the concentric circles 411, a connecting line 417 links the concentric circles 411 and the concentric circles 412. A displacement handle 413 displacing the input support tool up, down, left, and right is displayed in a central area of the concentric circles 412. A radius handle 414A is displayed on the inner circle 412A to change the size (radius) of the inner circle 411A. A radius handle 414B is displayed on the outer circle 412B to change the size (radius) of the outer circle 411B. Accordingly, even in a case where the display dimensions of the part to be manipulated are small and distinguishing the figures is difficult when the enlargement center is defined as the center of the figure, the displacement handle 413 and the radius handles 414A and 414B can be displayed at a size enabling easy manipulation. In addition, the displacement handle 413 and the radius handles 414A and 414B can be arranged separated from each other to a degree enabling easy manipulation.

In a case where the position of the enlarged display is no longer appropriate as a result of manipulating the enlarged display, the center (the point serving as reference for the enlarged display, or the center of similarity) or an enlargement factor of the enlarged display of the input support tool may be redefined as appropriate and the enlarged display may be re-displayed on the screen. An example of a case where the position of the enlarged display is no longer appropriate is a situation where visibility is adversely affected by the enlarged display overflowing outside the screen, the enlarged display being close to an edge of the screen, or the lines of the original, unenlarged input support tool being close to or overlapping with the lines of the enlarged display. In order to display the enlarged display at an appropriate position, an enlarged display of only a portion of the input support tool necessary for operation may be displayed.

Figure 20:
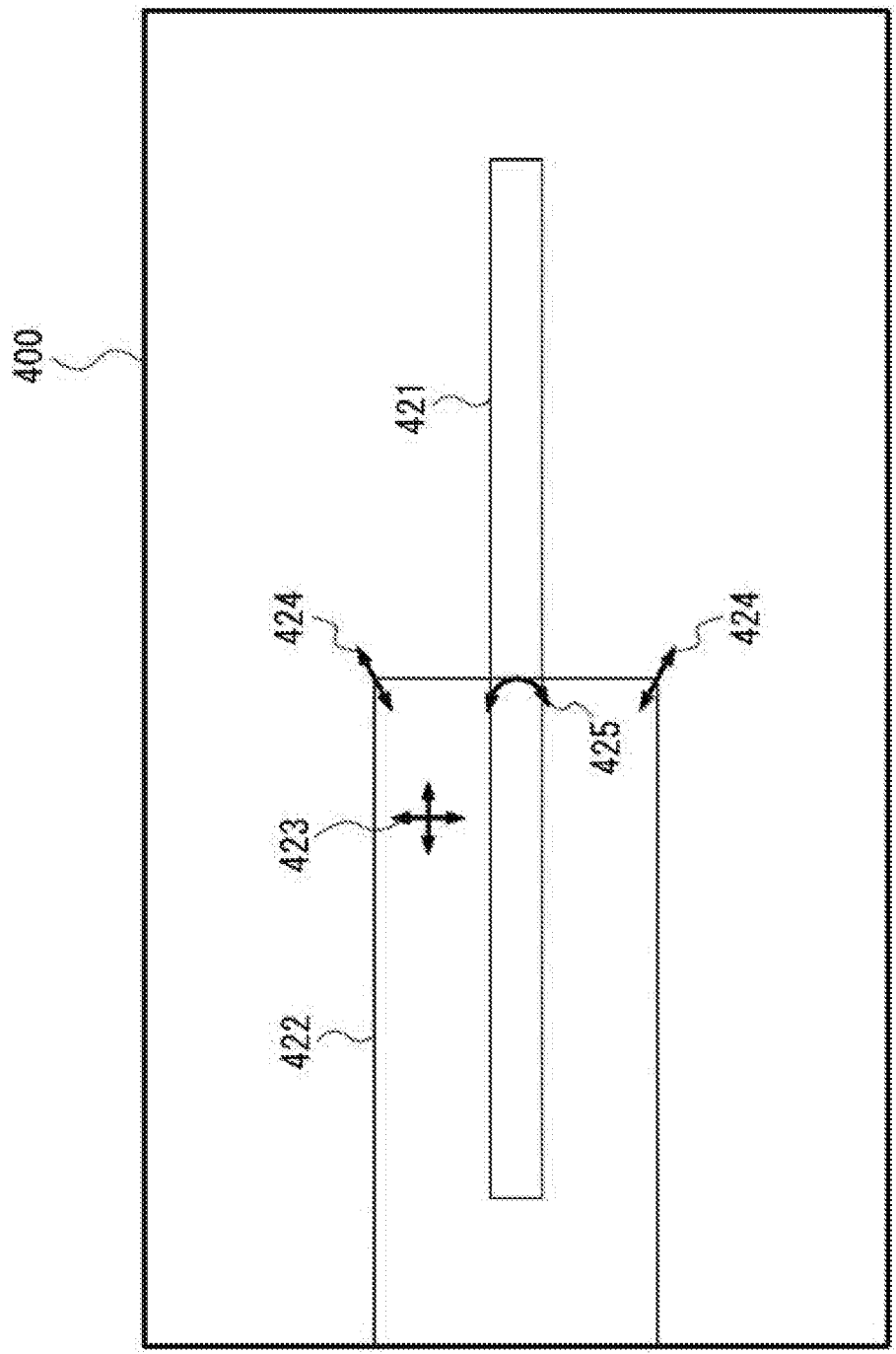
FIG. 20 illustrates a third example displaying an enlarged input support tool for a rectangle.

FIG. 20 illustrates another example in which an enlarged input support tool for a rectangle is displayed. In this example, as shown in FIG. 20, a strip-shaped rectangle 421 is displayed within the screen 400. Similar to the example shown in FIG. 17, when the display dimensions of the rectangle 421 are small, the user will have difficulty operating the handles even when the handles are displayed on the rectangle 421. Therefore, a rectangle is displayed, which is the rectangle 421 enlarged. However, because the rectangle 421 has a strip-like shape, no matter the position of the center of the enlargement, the enlarged rectangle will overflow outside the screen 400 in a length direction. Therefore, in this example, a partially enlarged FIG. 422 is displayed in which a portion of the rectangle 421 is enlarged. A displacement handle 423, vertex handles 424, and a rotation handle 425 of FIG. 20 correspond to the displacement handle 403, the vertex handles 404, and the rotation handle 405 of FIG. 17, respectively. Accordingly, even in a case where the display dimensions of the figure to be manipulated are small and the enlarged figure overflows outside the screen, by displaying a portion of the enlarged figure, the displacement handle 423, the vertex handles 424, and the rotation handle 425 can be displayed at a size enabling easy manipulation. In addition, the displacement handle 423, the vertex handles 424, and the rotation handle 425 can be arranged separated from each other to a degree enabling easy manipulation.

The input support tool need not be displayed at all times. For example, in a case where the user manipulates a handle corresponding to a given part, the display of the input support tool corresponding to a different part may be removed (no longer displayed). In addition, a configuration is also possible in which the input support tool is not displayed in an operation standby state, and when the user touches a part to be manipulated, or a vicinity thereof, the input support tool corresponding to the part to be manipulated is displayed.

In the foregoing, a description is given of an example where a figure is displayed enlarged. However, a schematic view of the figure may be displayed instead of an enlarged display. For example, a schematic view may be fixated at dimensions and in a shape enabling the user to easily manipulate the input support tool. Furthermore, a configuration is also possible in which the schematic view is displayed when the user taps the input support tool displayed on the screen with a finger and initiates editing. The schematic view is preferably displayed at dimensions and in a shape that do not prevent operation of the input support tool. Similar to the examples shown in FIGS. 17 to 19, the various handles are displayed on the schematic view. By dragging the handles of the schematic view, the input support tool changes shape, displaces, and rotates about a center. The amount by which the figure moves may be an amount determined by multiplying the displacement amount of the user's finger operating the handle on the display screen by a predetermined ratio. A configuration is also possible in which, in an operation to change dimensions or shape, the schematic view does not change, but instead a different element (handle or the like) of the input support tool changes. Also, in an operation displacing the input support tool, the schematic view may be configured to either displace together with the input support tool, or not. The schematic view may also be configured to rotate in conjunction with the input support tool in an operation rotating the input support tool. A configuration is also possible in which, in a case where the schematic view impedes operation, the schematic view can be dragged and displaced. In such a case, by dragging and displacing a portion of the schematic view where no handle is provided, inadvertent operation of the handle can be prevented.

In a case where the enlarged display and schematic view of the input support tool described above in the other embodiments are used, the enlarged display and the schematic view do not necessarily need to be separated from the original part (e.g., FIG. 17). In such a case, even when all or a portion of a handle is provided in a position not separated from the original part due to the display positions of the enlarged display and the schematic view, operation of the input support tool is possible. In other words, use of the enlarged display and schematic view of the input support tool (use of the other embodiments) itself can also be accomplished together with the first embodiment. However, it is understood that all or a portion of the handle can be provided at a position not separated from the original part and use of the other embodiments can also be accomplished independently of the first embodiment.

Moreover, the present invention is not limited to the embodiments described above, and may be modified as needed without departing from the scope of the present invention. The display controls described above may also be achieved with a computer on which an input support program is installed, or the input support program may be stored on a non-volatile storage medium and installed on the computer as needed.

It is noted that the foregoing examples have been provided merely for the purpose of explanation and are in no way to be construed as limiting of the present invention. While the present invention has been described with reference to exemplary embodiments, it is understood that the words which have been used herein are words of description and illustration, rather than words of limitation. Changes may be made, within the purview of the appended claims, as presently stated and as amended, without departing from the scope and spirit of the present invention in its aspects. Although the present invention has been described herein with reference to particular structures, materials and embodiments, the present invention is not intended to be limited to the particulars disclosed herein; rather, the present invention extends to all functionally equivalent structures, methods and uses, such as are within the scope of the appended claims.

The present invention is not limited to the above described embodiments, and various variations and modifications may be possible without departing from the scope of the present invention.

What is claimed is:

1. An input support method supporting input using a touch screen display performing display and reception of input by screen contact, the method comprising:
   obtaining a real-time image of a measurement region of a work piece captured by a camera;
   displaying an input support tool on a display screen of the touch screen display, the input support tool comprising:
      a diagram of the work piece; and
      a handle corresponding to at least a part of the diagram and enabling manipulation on the touch screen by finger contact of the at least a part of the diagram;
   arranging, on the display screen, the handle in a position separate from the at least a part of the diagram;
   causing the display screen to display the real-time image of the measurement region;
   detecting, on the display screen, user operation of the handle with at least one screen contact;
   causing the handle with the at least one screen contact to be provided to the real-time image of the measurement region;
   moving, on the display screen, the at least a part of the diagram in response to the detected user operation; and
   determining, by a display controller, an amount by which the at least a part of the diagram moves by multiplying a displacement amount of the user's screen contact operating the handle on the display screen by a predetermined ratio,
   wherein an amount of displacement ratio is proportional to the user's pressing force on the handle.

2. The input support method according to claim 1, wherein:
the input support tool further includes an action point defined for the at least a part of the diagram, the action point being a point where operation using the handle is effected, and
the moving of the diagram in response to the detected user operation comprises moving the action point.

3. The input support method according to claim 1, wherein:
the handle comprises a plurality of handles; and
during the moving of the at least a part of the diagram, handles other than the handle operated by the user's screen contact are undisplayed on the touch screen display.

4. The input support method according to claim 2, wherein:
the handle comprises a plurality of handles; and
during the moving of the at least a part of the diagram, handles other than the handle operated by the user's screen contact and action points corresponding to the other handles are undisplayed on the touch screen display.

5. The input support method according to claim 2, wherein the input support tool further includes a connecting line linking the action point with the handle.

6. The input support method according to claim 4, wherein the input support tool further includes a connecting line linking the action point with the handle.

7. The input support method according to claim 5, wherein:
the action point comprises a plurality of action points defined for a respective plurality of parts of the diagram; and
during the moving of the at least a part of the diagram, other connecting lines respectively linking the other action points with the other handles are undisplayed on the touch screen display.

8. The input support method according to claim 6, wherein:
the action point comprises a plurality of action points defined for a respective plurality of parts of the diagram; and
during the moving of the at least a part of the diagram, other connecting lines respectively linking the other action points with the other handles are undisplayed on the touch screen display.

9. A touch screen display device comprising:
a touch screen display; and
a display controller configured to control the touch screen display to display an input support tool on a display screen and display a real-time image of a measurement region of a work piece captured by a camera, the input support tool comprising:
a diagram of the work piece; and
a handle corresponding to at least a part of the diagram and enabling manipulation on the touch screen by finger contact of the diagram, wherein:
the handle is arranged in a position separate from the at least a part of the diagram;
the display screen displays the real-time image of the measurement region;
the display controller is configured to:
detect user operation of each handle by a screen contact;
cause the handle with the at least one screen contact to be provided to the real-time image of the measurement region;
move the at least a part of the diagram in response to the detected user operation; and
determine an amount by which the at least a part of the diagram moves by multiplying a displacement amount of the user's screen contact operating the handle on the display screen by a predetermined ratio, and
wherein an amount of displacement ratio is proportional to the user's pressing force on the handle.

10. An input method of a measuring apparatus, the method comprising:
obtaining a real-time image of a measurement region of a work piece captured by a camera;
displaying, on a touch screen, an input support tool is superimposed on one of a work piece image and a design image, the input support tool including:
a diagram of the work piece enabling designation of a range; and
a handle corresponding to at least a part of the diagram and enabling manipulation on the touch screen by finger contact of the at least a part of the diagram, arranging the handle in a position separated from the at least a part of the diagram;
causing the display screen to display the real-time image of the measurement region;
detecting user operation of the handle by a screen contact;
causing the handle with the at least one screen contact to be provided to the real-time image of the measurement region;
moving at least a part of the diagram in response to the detected user operation; and
determining, by a controller, an amount by which the at least a part of the diagram moves by multiplying a displacement amount of the user's screen contact operating the handle on the touch screen by a predetermined ratio,
wherein an amount of displacement ratio is proportional to the user's pressing force on the handle.

11. A measuring apparatus comprising:
a main body comprising: a measurement table to hold a work piece and a camera to obtain a real-time image of a measurement region of the work piece; and
a touch screen display comprising:
a touch screen; and
a display controller configured to control the touch screen to display an input support tool superimposed on one of a work piece image and a design image, the input support tool comprising:
a diagram of the work piece; and
a handle corresponding to at least a part of the diagram, and enabling manipulation on the touch screen by finger contact of the at least a part of the diagram, wherein:
the handle is arranged in a position separate from the at least a part of the diagram;
the display screen displays the real-time image of the measurement region;
the display controller is further configured to:
detect a user operation of each handle by the user's screen contact;
cause the handle with the at least one screen contact to be provided to the real-time image of the measurement region;

determine an amount by which the at least a part of the diagram moves by multiplying a displacement amount of the user's screen contact operating the handle on the touch screen by a predetermined ratio, wherein an amount of displacement ratio is proportional to the user's pressing force on the handle; and move at least a part of the diagram, in response to the detected user operation.

* * * * *